(12) United States Patent
Hirano

(10) Patent No.: US 6,331,949 B1
(45) Date of Patent: Dec. 18, 2001

(54) CIRCUIT FOR STORING AND LATCHING DEFECTIVE ADDRESS DATA FOR A NONVOLATILE SEMICONDUCTOR MEMORY DEVICE HAVING REDUNDANT FUNCTION

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/745,526

(22) Filed: Dec. 26, 2000

(30) Foreign Application Priority Data

Dec. 24, 1999 (JP) .................................................. 11-366938

(51) Int. Cl.[7] .................................................. G11C 16/06
(52) U.S. Cl. ................ 365/185.09; 365/200; 365/185.18
(58) Field of Search ............................... 365/185.09, 200, 365/185.18, 189.05

(56) References Cited

U.S. PATENT DOCUMENTS

| 4,656,609 | * | 4/1987 | Higuchi et al. ...................... 365/200 |
| 5,313,424 | * | 5/1994 | Adams et al. .................... 365/200 X |
| 5,383,162 | * | 1/1995 | Shirai et al. ...................... 365/200 X |
| 5,602,777 | * | 2/1997 | Nawaki et al. .................. 365/185.09 |
| 5,606,523 |   | 2/1997 | Mirabel . |

FOREIGN PATENT DOCUMENTS

| 5-276018 | 10/1993 | (JP) . |
| 8-22699  | 1/1996  | (JP) . |

* cited by examiner

*Primary Examiner*—Huan Hoang
(74) *Attorney, Agent, or Firm*—Morrison & Foerster LLP

(57) ABSTRACT

A circuit for storing and latching defective address data representing an address of a defective portion occurring in a memory cell array of a nonvolatile semiconductor memory device having a redundant function. The circuit includes floating gate field effect transistors and latch circuits. Each floating gate field effect transistor assumes one of a high-threshold state and a low-threshold state, and has a threshold of 0 volts or less (e.g. 0 to −2.5 volts) when in the low-threshold state.

23 Claims, 22 Drawing Sheets

DATA "1"

DATA "0"

DATA "0"

DATA "1"

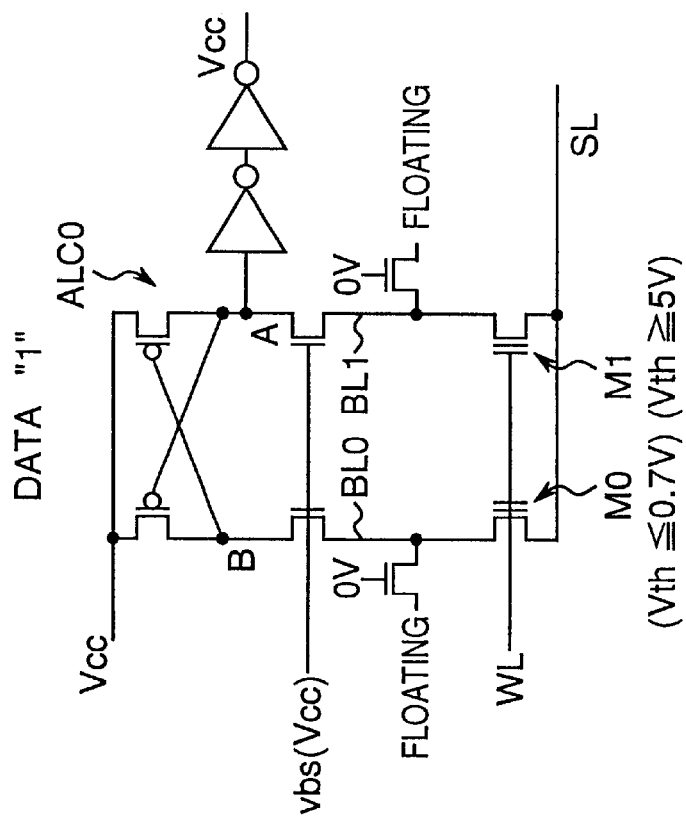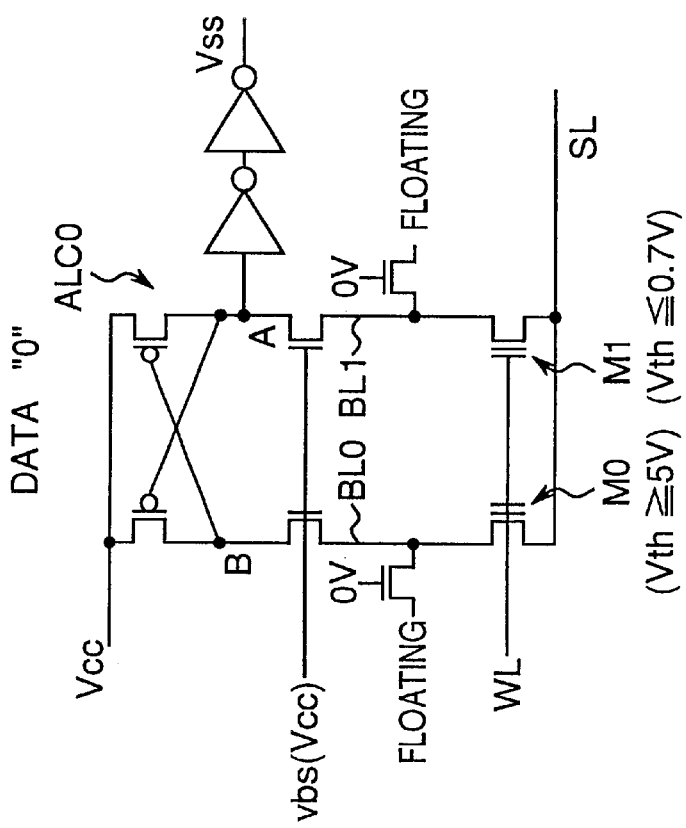

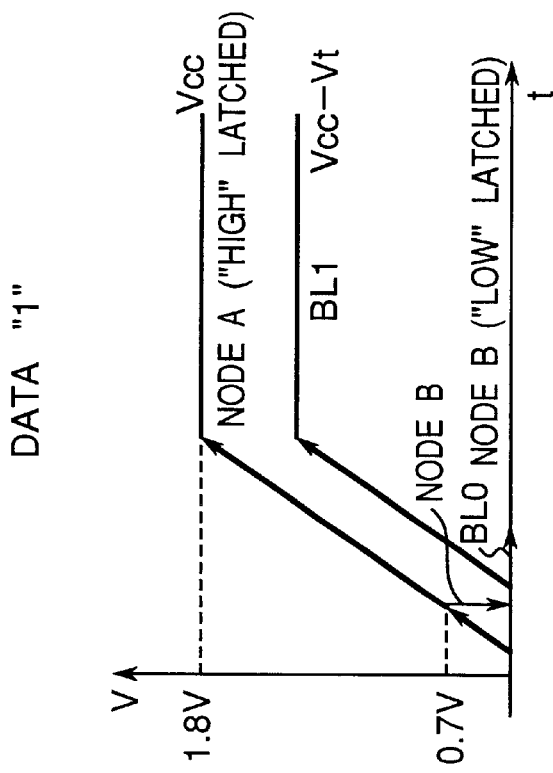
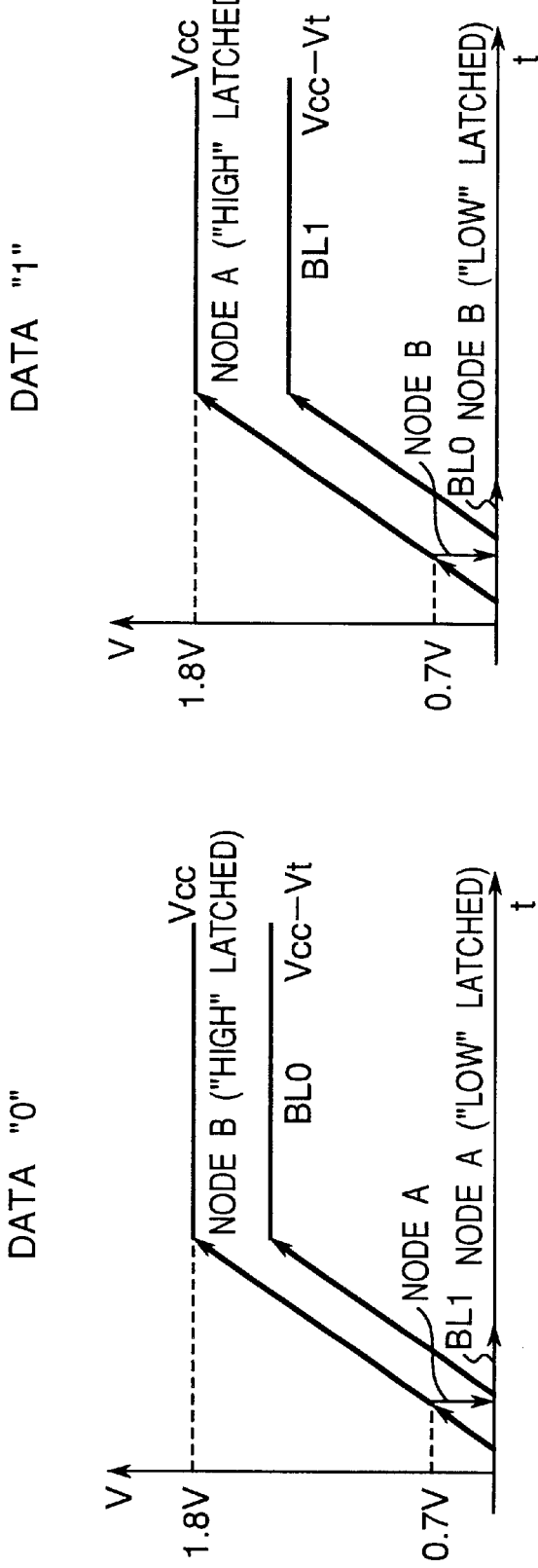

DATA "0"

DATA "1"

DATA "1"

DATA "0"

CIRCUIT FOR STORING AND LATCHING DEFECTIVE ADDRESS DATA FOR A NONVOLATILE SEMICONDUCTOR MEMORY DEVICE HAVING REDUNDANT FUNCTION

BACKGROUND OF THE INVENTION

The present invention relates to a nonvolatile semiconductor memory device having a redundant function of relieving a defective portion inside a memory cell array by substituting a reserved or relief portion (redundancy) for the defective portion, and in particular, to a circuit incorporated in such a nonvolatile semiconductor memory device for storing and latching the address data of the defective portion.

In connection with nonvolatile semiconductor memory devices, there is a known method for replacing defective bit lines, defective word lines and defective memory cells with reserved normal ones (redundancy) to increase the yield. In the nonvolatile semiconductor memory device utilizing such a method, the addresses of the defective bit lines, the defective word lines and the defective memory cells, i.e., the defective address data are required to be stored.

(First Related Background Art)

To store the data representing the defective address, use of electrically rewritable nonvolatile semiconductor memory cells is known from Japanese Patent Application Laid-Open No. 5-276018. An example of such a method is described below with reference to FIG. 25 showing a circuit for storing and latching the defective address data. For example, the case in which an address "101" is stored in this circuit is described below. The circuit shown in FIG. 25 is adapted to a flash memory, represented by ETOX™, to which writing is executed by using a channel hot electron. In the conventional flash memory of this type, memory cells M0, M1, and M2 in an initial state have a threshold (gate threshold voltage) of about 0.5 volts to 2.5 volts.

The writing or programming is executed by using channel hot electrons as follows. Initially, an H(high)-level equivalent to a value of "1" is supplied to a data line DL shown in FIG. 25. Then, an L(low)-level is latched in a write data latch circuit DLC. On the other hand, the potential of a word line WL for the memory cells M0, M1, and M2 rises to a Vpp (for example, 10 volts), and the potential of a bit line selection signal bitsel0 has also the potential Vpp. At this time, 0 volts is output from a level shifter HV, with a bit line BL0 having a floating state and the threshold of the memory cell M0 kept at the low voltage (2.5 volts or less). Then in writing data "0", an L-level is supplied to the data line DL, an H-level is latched in the write data latch circuit DLC, and the potential of the word line WL of the memory cells rises to the Vpp level. The potential of the bit line selection signal bitsel1 also becomes the Vpp level. The output of the level shifter HV, in which the H-level is latched, assumes the potential Vpp. Thus, a voltage hhprg (for example, 6 volts) is output to a bit line BL1. As a result, the threshold of the memory cell M1 rises to a voltage of 5 volts or more owing to the channel hot electrons, as shown in FIG. 20. The memory cell M2 is kept in a low-threshold state, similar to the memory cell M0.

The operation of the defective address latch circuit ALC (ALC0, ALC1, ALC2) upon turn-on of the power supply of the memory device will be described below with reference to FIGS. 21A, 21B, 22A, and 22B. FIGS. 21A and 21B each show a circuitry of a basic cell for storing one bit of the defective address data. First, when the data "0" is stored in the memory cell M1, as shown in FIG. 21B, as a supply voltage Vcc rises, the potential of a node A increases owing to coupling, following the supply voltage Vcc, as indicated by a power supply turn-on waveform of FIG. 22B. Because the threshold, Vth, of the memory cell M1 is 5 volts or more in this case, the memory cell M1 is off and electric current does not flow therethrough, and an output radd1 latches and supplies a "0".

Referring to FIG. 21A, the memory cells M0 and M2 store the data "1". Thus, as indicated by a power supply turn-on waveform of FIG. 22A, once the word line has a voltage of 2.5 volts or more, electric current starts to flow through the memory cells M0 and M2, and the node A, which initially followed the supply voltage Vcc, drops to the level L. This is because electric current flows through the memory cells M0 and M2. As a result, outputs radd0 and radd2 have a "1"-latched state, respectively.

(Second Related Background Art)

In the first related background art, one bit of address information is stored by one memory cell. Another method for storing address information is known from Japanese Patent Application Laid-Open No. 8-22699, in which two memory cells are used to store one bit of address information. An example of such a method is described below with reference to FIG. 26 on the case in which an address "101" is stored in the circuit of FIG. 26. The circuit shown in FIG. 26 is applied to a flash memory (represented by ETOX™) to which programming is executed using a channel hot electron. In the known flash memory of this type, thresholds of memory cells are about 0.5 volts–2.5 volts in an initial state. FIG. 20 shows the threshold states.

According to this technique, programming is executed by using the channel hot electron as follows. Initially, an H(high)-level is supplied to a data line DL shown in FIG. 26. Then, an L(low)-level is latched into a write data latch circuit DLC. The potential of a word line WL associated with the memory cells M0 through M5 rises to a Vpp (for example, 10 volts), and the potential of a bit line selection signal bitsel0 has also the potential Vpp. At this time, a bit line BL0 is in a floating state. As a result, the threshold of the memory cell M0 is kept at the low level (2.5 volts or less).

In the following operation, an L-level is supplied to the data line DL, and an H-level is latched into the write data latch circuit DLC. On the other hand, the potential of the word line WL for the memory cells M0 through M5 rises to Vpp (for example, 10 volts). In addition, the potential of the bit line selection signal bitsel1 becomes Vpp and a voltage hhprg (for example, 6 volts) is supplied to a bit line BL1. Channel hot electrons are thus generated in the memory cell M1 and its threshold rises to a voltage of 5 volts or more.

On the other hand, to have a second defective address latch circuit ALC1 latch a "0", the memory cell M2 is placed in a programmed state (the threshold being 5 volts or more), and the memory cell M3 is kept in the erased state (in which the threshold is low). Also, to have a third defective address latch circuit ALC1 latch data "1", the memory cell M4 is placed in the erased state, while the memory cell M5 is kept in the programmed state.

The defective address latch circuits ALC0, ALC1, and ALC2 each latch one data by using two memory cells having different threshold states. More specifically, one data is latched using one memory cell whose threshold is 2.5 volts or less in combination with the other memory cell whose threshold is 5 volts or more.

The address latch operation will be described below with reference to FIGS. 23A, 23B, 24A, and 24B.

First, latch of data "0" by the defective address latch circuit is described below with reference to FIGS. 23A and 24A. In this case, the threshold, Vth, of the memory cell M0 is high (Vth≧5 volts), whereas the threshold, Vth, of the memory cell M1 is low (Vth≦2.5 volts). As indicated by a power supply turn-on waveform of FIG. 24A, when the supply voltage Vcc increases and the potential of the word line WL becomes 2.5 volts or more, an electric charge is extracted from the node A because the threshold of the memory cell M1 is low. Thus, the potential of the node A becomes 0 volts. At this time, because the threshold of the memory cell M0 is 5 volts or more, the potential of the node B is kept at a high level (2.5 volts). As a result, the ground-side potential Vss (data "0") is supplied to the output radd.

Next, latch of data "1" by the defective address latch circuit is described below with reference to FIGS. 23B and 24B. In this case, the threshold, Vth, of the memory cell M0 is low (Vth≦2.5 volts), whereas the threshold, Vth, of the memory cell M1 is high (Vth≧5 volts). As indicated by a power supply turn-on waveform of FIG. 24B, when the supply voltage Vcc increases and the potential of the word line WL becomes 2.5 volts or more, an electric charge is extracted from the node B because the threshold of the memory cell M0 is low. Thus, the potential of the node B becomes 0 volts. On the other hand, because the threshold of the memory cell M1 is 5 volts or more, the potential of the node A is kept at a high level (2.5 volts). As a result, the power supply voltage Vcc (data "1") is supplied to the output radd.

Thus, with this technique, it is possible to stably obtain two data owing to the difference between the threshold of the memory cell M0 and that of the memory cell M1.

However, the techniques according to the first and second related background arts have the following common problems (1) and (2).

(1) The address latch does not become definite until the supply voltage becomes 2.5 volts or more after the power is turned on.

(2) The address latch circuit has an unstable operation when the supply voltage is lower than 2.5 volts and cannot operate at a low voltage. That is, the address latch circuit cannot operate at a voltage lower than 2.5 volts.

The problem (1) is described below in connection with the first related background art, with reference to FIGS. 21A, 21B, 22B, and 22B. When the supply voltage Vcc starts to rise but is less than 2.5 volts, as understood from FIG. 22A and 22B, the node A is placed in the state "H". Accordingly, whether the memory cell stores data "0" or "1", the output radd has the ground potential Vss. This is because as shown in FIG. 20, the upper limit of the threshold of the memory cell placed in the erased state (memory cell at "L" side) is 2.5 volts, in which case electric current does not flow through even the memory cell storing the data "1".

In the second related background art as well, the upper limit of the threshold of the memory cell in the erased state ("L" side) is also 2.5 volts as shown in FIG. 20. Thus, electric current does not flow through the memory cells M0, M1 shown in FIGS. 23A and 23B and the latching state is not stable. Whether the ground-side potential Vss or the supply voltage Vcc is output from the output radd depends on the layout of the circuit. Because inverters for signal-output are connected with the node A, the ground-side potential Vss is output from the output radd.

As described above, in both of the first and second related background arts, when the supply voltage is lower than 2.5 volts, the defective address latch circuit is incapable of correctly latching an address. Before the supply voltage rises completely up to 2.5 volts or more, the defective address latch circuit is in a state latching not an address "101" but an address "000", the latter address being for a non-defective block. Thus, at this time, if a user makes an access to erase the non-defective block corresponding to the address "000" in the memory device, the block at the address "000" is recognized erroneously as a defective block and the corresponding redundancy block at the address "000" is erroneously erased. Further, data in the non-defective block at the address "000" proper in the memory device, which the user wished to erase, remain unerased.

As is obvious, because the threshold of the memory cell in the initial state is conventionally set to the range of 0.5 volts to 2.5 volts, the memory device can malfunction when it is operated at the supply voltage lower than 2.5 volts, and in the worst case, necessary data may be erased.

The content of the problem (2) is similar to what has been described above in connection with the problem (1). That is, the memory device cannot be operated at the supply voltage lower than 2.5 volts.

In recent years, as flash memory-applied goods, more and more portable terminals such as portable telephones have been commercially available. There is a growing demand for operating the portable terminals at a low voltage to save power consumption. Accordingly, it is a very important issue to design a device operable at a low voltage.

SUMMARY OF THE INVENTION

Therefore, it is an object of the present invention to provide a circuit for storing and latching defective address data representing an address of a defective portion occurring in a memory cell array of a nonvolatile semiconductor memory device, wherein the circuit is free from a malfunction at the rise time of a supply voltage and operable at a low voltage.

In order to accomplish the above object, there is provided, according to a first aspect of the present invention, a circuit for storing and latching defective address data representing an address of a defective portion occurring in a memory cell array of a nonvolatile semiconductor memory device having a redundant function, comprising:

floating gate field effect transistors for storing defective address data, each floating gate field effect transistor being electrically erasable and programmable and having a control gate, a drain, and a source;

a word line connected to the control gates of the floating gate field effect transistors;

bit lines connected to the drains of the floating gate field effect transistors;

a source line connected to the sources of the floating gate field effect transistors; and latch means for latching the data stored in the floating gate field effect transistors, wherein each floating gate field effect transistor assumes one of a high-threshold state and a low-threshold state, and has a threshold of 0 volts or less when in the low-threshold state.

With this arrangement, because the floating gate field effect transistor has a threshold of 0 volts or less when in the low-threshold state, data stored in the floating gate field effect transistor can be correctly read out and latched by the latch means even before the supply voltage has risen completely. Accordingly, the circuit of the invention can operate without a malfunction at the rise time of the supply voltage and at a low voltage.

In one embodiment, the threshold of the floating gate field effect transistor in the low-threshold state is from 0 volts to about −2.5 volts.

In this case, the threshold of each of said floating gate field effect transistors may be verified by applying a reference voltage to the control gate thereof via the word line. The reference voltage is stable and lower than a supply voltage. Thus, the verify operation can be performed at a reduced power consumption.

In another embodiment, the threshold of the floating gate field effect transistor in the low-threshold state is less than 0 volts (e.g., −0.5 volts) such that the threshold of each of said floating gate field effect transistors is verified by applying a negative voltage to the control gate thereof via the word line. In this case, even when a ground potential is applied to the control gate of the floating gate field effect transistor, electric current flows sufficiently through the floating gate field effect transistor. Accordingly, upon turning the power on, the defective address can be latched by the latched means rapidly.

In operation, a reference voltage, which is stable and lower than a power voltage, may be applied to the control gates of floating gate field effect transistors that have been programmed with defective address data.

There is also provided, according to another aspect of the present invention, a circuit for storing and latching defective address data representing an address of a defective portion occurring in a memory cell array of a nonvolatile semiconductor memory device having a redundant function, comprising:

floating gate field effect transistors for storing defective address data, each floating gate field effect transistor being electrically erasable and programmable and having a control gate, a drain, and a source;

a word line connected to the control gates of the floating gate field effect transistors;

bit lines connected to the drains of the floating gate field effect transistors;

a source line connected to the sources of the floating gate field effect transistors;

N-MOS transistors provided on the bit lines; and latch means connected to the floating gate field effect transistors via the bit lines and the N-MOS transistors for latching the data stored in the floating gate field effect transistors, wherein each floating gate field effect transistor assumes one of a high-threshold state and a low-threshold state, and has a threshold equal to or lower than a threshold of the N-MOS transistors when in the low-threshold state.

In this circuit, the threshold of the floating gate field effect transistor in the low-threshold state is equal to or lower than the threshold of the N-MOS transistor. Therefore, it is possible to prevent increase (disturb) of the threshold which is liable to occur in operation when the threshold in the low-threshold state has a negative value. Also, it is possible to latch the defective address at a high speed after the power is turned on. Further, by setting the threshold of the floating gate field effect transistor constituting a memory cell to be equal to or lower than the thresholds (lower than a supply voltage) of N-MOS transistors and CMOS transistors which do not serve as memory cells, it is possible to ensure the latch operation from the threshold voltage of one N-MOS transistor up to the supply voltage, without being affected by the threshold of the memory cell. Thus, the operation at a very low voltage is achieved.

In the circuit, the threshold of each of said floating gate field effect transistors can be verified by applying a voltage equivalent to the threshold of the N-MOS transistor to the control gate thereof via the word line.

In operation, a supply voltage may be applied to the control gates of floating gate field effect transistors which have been programmed with defective address data. In this case, large electric current is allowed to flow through the floating gate field effect transistor when the supply voltage rises and thus an abrupt voltage rise is achieved.

In one embodiment, a power voltage is about 1.8 volts, and the threshold of the floating gate field effect transistor in the low-threshold state is about 0.7 volts or less.

In the circuit according to either aspect of the invention, one floating gate field effect transistor may be used to store one bit of the defective address data. Alternatively, one pair of floating gate field effect transistors may be used to store one bit of the defective address data.

As is easily understood from the above, if a nonvolatile semiconductor memory device having a redundant function incorporates the circuit of the invention, the memory device can operate well at a reduced voltage.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 13A is an explanatory view for explaining how a basic cell constructed of a defective address latch circuit ALC0 and memory cells M0 and M1 of the fourth embodiment of the present invention latches data "0";

FIG. 13B is an explanatory view for explaining how the basic cell latches data "1";

FIG. 14A is a voltage waveform chart of the defective address latch circuit corresponding to FIG. 13A;

FIG. 14B is a voltage waveform chart of the defective address latch circuit corresponding to FIG. 13B;

DETAILED DESCRIPTION OF THE PREFERRED EMBODIMENTS

Figure 1:
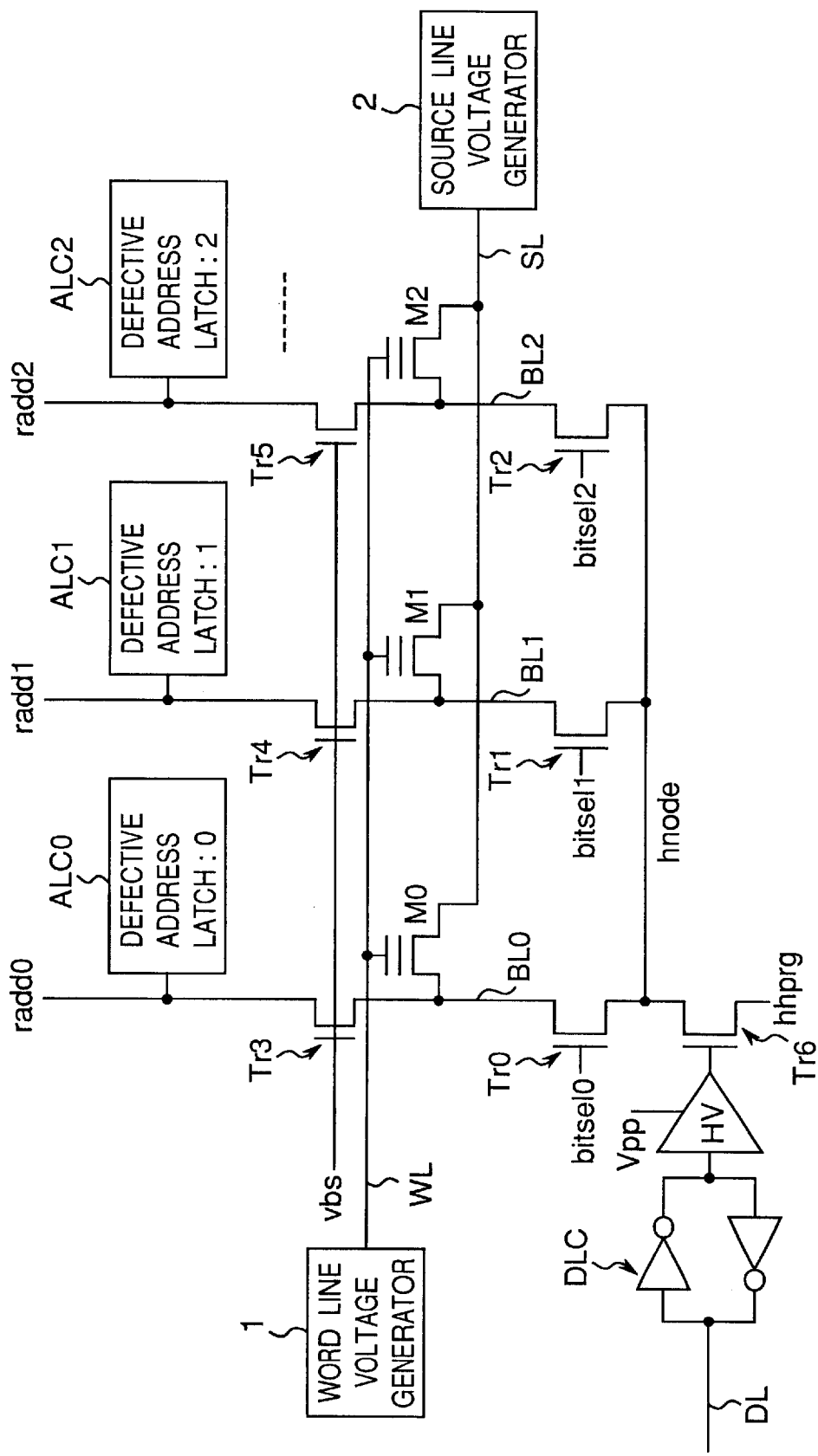
FIG. 1 is a circuit diagram showing a circuit for storing and latching a defective address according to a first embodiment of the present invention.

Embodiments of the present invention will be described in detail below with reference to the drawings in which same or similar parts are denoted by same reference numerals.

(First Embodiment)

FIG. 1 shows a first embodiment of the circuit for storing and latching defective address data of the present invention, which is incorporated in a nonvolatile semiconductor memory device. The circuit of the first embodiment has defective address latch circuits ALC0, ALC1, and ALC2 and memory cells M0, M1, and M2. A control gate of each of the memory cells M0, M1, and M2 is connected to a word line WL and a source thereof is connected to a source line SL. The word line WL and the source line SL are connected to a word line voltage generator 1 having a circuit construction shown in FIG. 27 and a source line voltage generator 2 having a circuit construction shown in FIG. 28 respectively. Drains of the memory cells M0, M1, and M2 are connected to bit lines BL0, BL1, and BL2, respectively. The bit lines BL0, BL1, and BL2 are connected to outputs radd0, radd1, and radd2, respectively through respective transistors Tr3, Tr4, and Tr5. The outputs radd0, radd1, and radd2 are connected to defective address latch circuits ALC0, ALC1, and ALC2, respectively.

The outputs radd0, radd1, and radd2 are connected to a transistor Tr6 via the transistors Tr3 and Tr0, Tr4 and Tr1, and Tr5 and Tr2, respectively. A gate of the transistor Tr6 is connected to an output side of a high-voltage level shifter HV. An input side of the high-voltage level shifter HV is connected to a data line DL via a write data latch circuit DLC.

Figure 6:
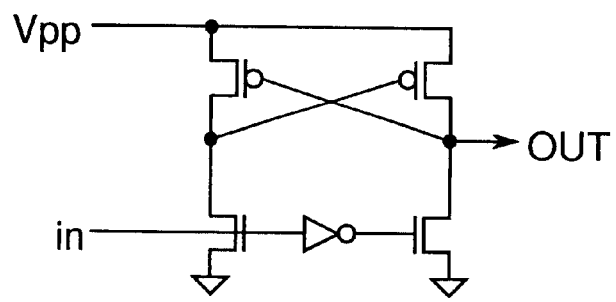
FIG. 6 is a circuit diagram of a high-voltage level shifter used in the circuit of the first embodiment.

As shown in FIG. 6, in the high-voltage level shifter HV, when an input 'in' is at a ground-side potential, Vss, an output 'OUT' delivers a voltage of the Vss level, whereas when the input 'in' is at a Vcc level of the supply voltage, the output 'OUT' delivers a voltage of a Vpp level.

Figure 2:
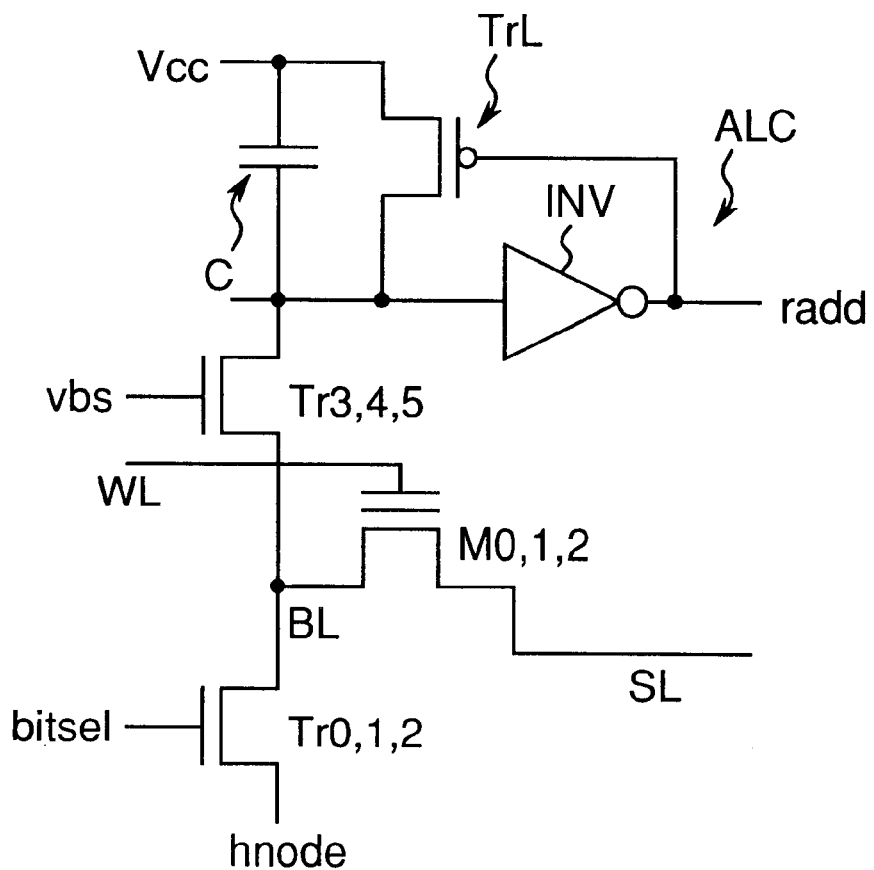
FIG. 2 is a circuit diagram showing a basic cell of a defective address latch circuit that is used in the first embodiment.

FIG. 2 shows the construction of a circuit, included in the memory device, having one defective address latch circuit ALC and one memory cell M. As shown in FIG. 2, in the defective address latch circuit ALC, a parallel circuit having one capacitor C and one P-MOS transistor TrL is connected to an input side of one inverter INV, and an output side of the inverter INV is connected to a gate of the transistor TrL. The output side of the inverter INV is the output radd of the defective address latch circuit ALC.

In the first embodiment, the threshold voltage of the memory cell M in an initial state that is connected to the defective address latch circuit ALC which has latched the data "0" is set to a voltage of 0 volts or less.

The operation of the first embodiment is described below with reference to FIG. 1.

Initially, the threshold of each of the memory cells M0, M1, and M2 connected to the defective address latch circuits ALC0, ALC1, and ALC2 is lowered. In the first embodiment, for brief description, only three memory cells M0, M1, and M2 are used as an example. Lowering the threshold of each of the memory cells M0, M1, and M2 means extraction of electrons from a floating gate of each memory cell. In the first embodiment, the extraction of electrons will be described as an erase operation.

The extraction of electrons may be executed as a write operation or erase operation. Whether the extraction of electrons is executed as the write operation or as the erase operation depends on the initial state of the memory cell.

Figure 5:
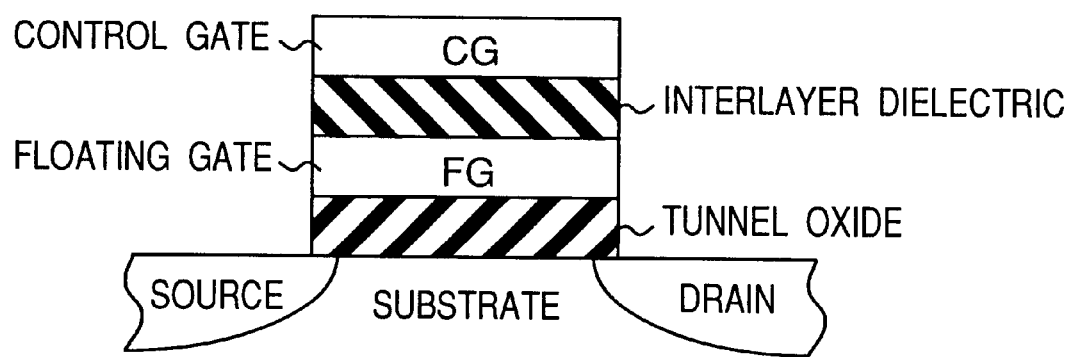
FIG. 5 shows a basic construction of a flash memory device constituting a memory cell used in the first embodiment.

The erasure of the memory cells M0, M1, and M2 connected to the defective address latch circuits ALC0, ALC1, and ALC2, respectively, is performed as follows:

Initially, the word line voltage generator 1 applies a negative high voltage, for example, −9 volts to the word line WL connected to the control gate of each of the memory cells M0, M1, and M2. Then, the source line voltage generator 2 applies a positive high voltage, for example, 6 volts to the source line SL commonly connected to the source of each of the memory cells M0, M1, and M2. More specifically, referring to FIG. 27, with sig kept low, hneg has a voltage of −9 volts, and hhpx has a voltage of Vcc. As a result, a voltage of −9 volts is delivered to the word line WL. On the other hand, a control signal line vbs and bit selection signal lines bitsel0 through bitsel2 have an L level. Thus, the N-MOS transistors Tr0, Tr1, Tr2, Tr3, Tr4, and Tr5 to which signals on those lines are supplied at the gates thereof are OFF. Accordingly, the bit lines BL0, BL1, and BL2, to which the drains of the memory cells M0, M1, and M2 are connected, have a high-impedance state, so that the drain of each memory cell becomes floating. As a result, as shown in FIG. 5, in each of the memory cells M0, M1, and M2, electrons are extracted from the floating gate to the source side and the threshold voltages of the memory cells M0, M1, and M2 are reduced.

After the voltages for erasure have been applied to the circuit in the erase operation as described above, whether the thresholds of all the memory cells connected to the defective address latch circuit have become 0 volts or lower, respectively is verified.

The verify operation for the memory cell M0 is performed as follows: Initially, the ground-side potential Vss (namely a reference voltage) of 0 volts, for example, is applied to the word line WL. Then, the bit selection signal line bitsel0 is set to an H level (Vcc) of 1.8 volts so that the N-MOS transistor Tr0 is conductive. The ground-side potential Vss, for example, 0 volts is applied to the source line SL commonly connected to the sources of the memory cells M0, M1, and M2. One volt is applied to a node hnode and it is detected whether or not an electric current flows through the memory cell M0, by the comparison with a set reference voltage at a sense amplifier (not shown) connected to the node hnode. If it is determined that electric current flows therethrough, it is concluded that the threshold of the memory cell M0 is 0 volts or less, i.e., the memory cell M0 is placed in an erased state.

Similarly, the verify operations for the memory cells M1 and M2 are performed sequentially. If it is determined that the thresholds of all the memory cells are 0 volts or less, the erase operation is completed. If even one memory cell having a threshold voltage of more than 0 volts is detected, the voltages for erasure are applied again to the circuit. In this manner, the erase and verify operations are repeatedly executed until the thresholds of all the memory cells become 0 volts or less.

Figure 15:
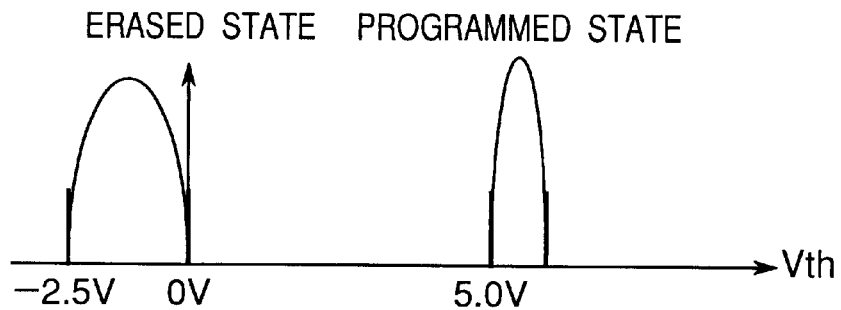
FIG. 15 shows threshold states of the memory cell in the first and second embodiments.

As shown in FIG. 15, after the erase operation has been completed, the thresholds of the memory cells placed in the erased state are distributed in the range between 0 volts and −2.5 volts.

Next, the operation of storing (programming) a defective address in the memory cell placed in the threshold-reduced state will be described below.

The write (program) operation is performed by using channel hot electrons. The operation of writing data "101" as the defective address to the memory cells will be described below. The data "101" is transmitted serially. Initially, an H level (Vcc level) corresponding to data "1" is applied to the data line DL. The data "1" is intended to be stored in the memory cell M0. The data "1" is latched by the write data latch circuit DLC and becomes an L-level (Vss level) signal. Then, through the high-voltage level shifter Hv, the L-level (Vss level) signal turns the gate of the N-MOS transistor Tr6 to an L level. Thereby, the N-MOS transistor Tr6 is turned off.

Figure 27:
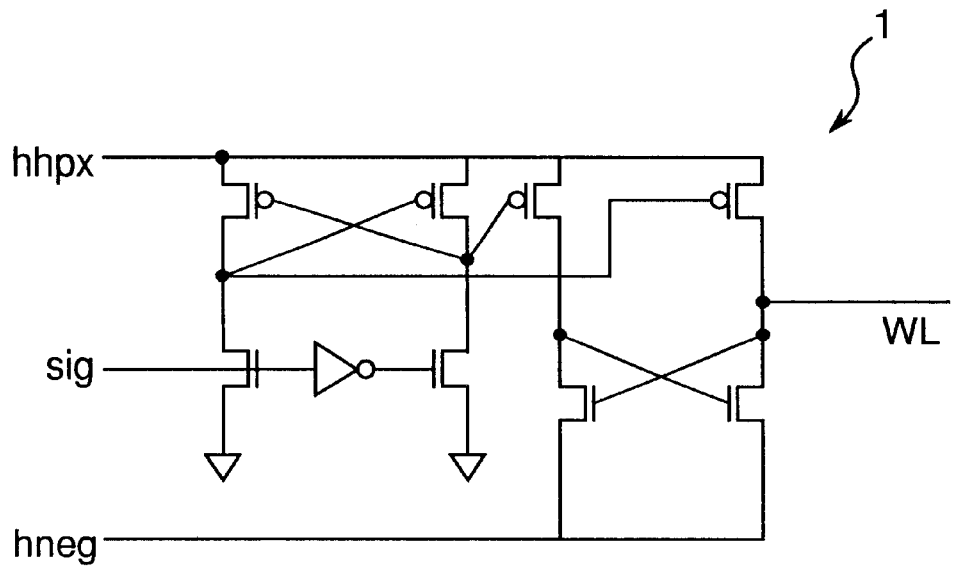
FIG. 27 is a circuit diagram of a word line voltage generator that is used in the circuit of FIGS. 1 and 7.
Figure 28:
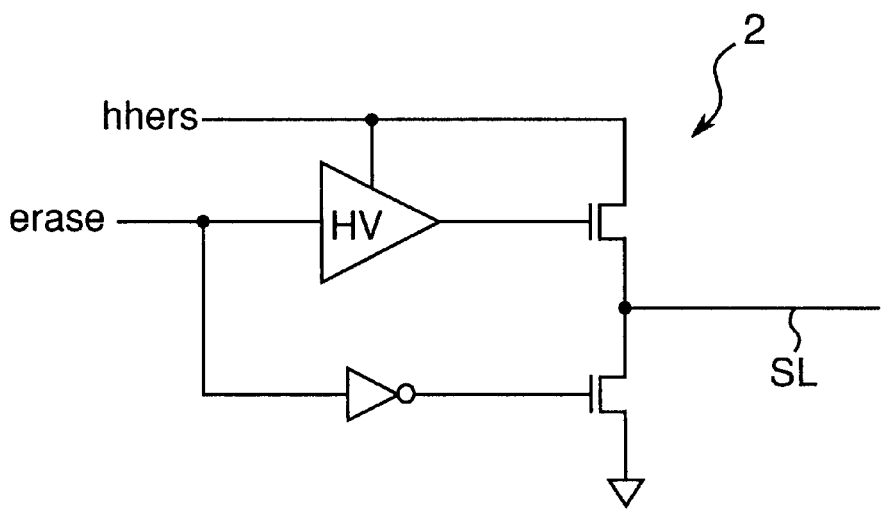
FIG. 28 is a circuit diagram of a source line voltage generator that is used in the circuit of FIGS. 1 and 7.

To write the data "1" to the memory cell M0, in the word line voltage generator 1 shown in FIG. 27, hhpx is set to 10 volts, hneg is set to the Vss level, and sig is set to the high state. As a result, a potential Vpp (for example, 10 volts) is applied to the word line WL. The potential Vpp is also applied to the bit selection signal line bisel0. Although not shown, the high-voltage level shifter HV is connected to the bit selection signal line. Thereby, the N-MOS transistor Tr0 is turned on, and the N-MOS transistors Tr1 and Tr2 remain off. At this time, the transistor Tr6 is off. Thus, the bit line BL0 has the high-impedance state. That is, the drain of the memory cell M0 is in the floating state. Accordingly, although the potential Vpp is applied to the word line WL and 0 volts is applied to the source line SL, the memory cell M0 is not programmed. Thus, the threshold of the memory cell M0 is maintained at a low voltage of 0 volts or less.

Then, an L-level signal corresponding to the data "0" to be stored in the subsequent memory cell M1 is supplied to the data line DL. Then, the write data latch circuit DLC inverts the signal and latches an H-level signal at its output. The H-level signal is shifted to the Vpp level through the high-voltage level shifter Hv. The Vpp-level signal turns on the N-MOS transistor Tr6.

Then, as described previously, the word line WL is raised to the potential Vpp. The potential of the bit selection signal line bisel1 is also raised to the Vpp level to turn on the N-MOS transistor Tr1 connected to the bit line BL1 of the memory cell M1. At this time, the N-MOS transistors Tr0 and Tr2 are off. Accordingly, a voltage hhprg of for example, 6 volts is applied to the drain of the memory cell M1 via the bit line BL1. The ground-side potential Vss of e.g., 0 volts is applied to the common source line SL. Thereby, programming the memory cell M1 is executed by channel hot electrons. That is, electrons are injected to the floating gate from the drain side. As a result, the threshold of the memory cell M1 rises to a voltage of 5 volts or more. As in the erase operation, the write or program operation is executed to set the threshold of the memory cell to a predetermined one while write and verify operations are executed alternately. FIG. 15 shows the threshold of the memory cell placed in the written (programmed) state and the distribution of the thresholds. The threshold of the memory cell M1 connected to the defective address latch circuit ALC1 is 5 volts or more after writing is executed thereto.

Then, the H-level signal corresponding to the data "1" to be stored in the subsequent memory cell M2 is supplied to the data line DL. The H-level signal is latched and inverted to the L-level (Vss level) signal by the write data latch circuit DLC. Then, through the high-voltage level shifter Hv, the L-level (Vss level) signal turns the gate of the N-MOS transistor Tr6 to an L level so that the N-MOS transistor Tr6 is turned off. Then, to write the data "1" to the memory cell M2, the potential Vpp (for example, 10 volts) is applied to the word line WL. The potential Vpp is also applied to the bit selection signal line bisel2, whereby the N-MOS transistor Tr2 is turned on, with the N-MOS transistors Tr0 and Tr1 off respectively, whereas the transistor Tr6 is off. Thus, the bit line BL2 has a high-impedance state. That is, the drain of the memory cell M2 has a floating state. Accordingly, although the potential Vpp is applied to the word line WL, and the ground-side potential Vss is applied to the source line SL, writing to the memory cell M2 is not executed. Thus, the threshold of the memory cell M2 is maintained at a low voltage of 0 volts or less.

In the manner described above, the defective address information "101" is stored in the memory cells M0, M1, and M2 connected to the defective address latch circuits ALC0, ALC1, and ALC2, respectively.

In using the nonvolatile semiconductor memory device including the circuitry shown in FIG. 1 according to the first embodiment, upon turn-on of the power supply, the supply voltage Vcc of 1.8 volts is applied to the control signal line vbs, and the N-MOS transistors Tr3, Tr4, and Tr5 are turned on upon the rise of the supply voltage Vcc. Thereby, data written to each of the memory cells M0, M1, and M2 are latched by the defective address latch circuits ALC0, ALC1, and ALC2. FIG. 2 shows the construction of a circuit having one defective address latch circuit ALC0 and one memory cell M0 connected thereto. This circuit construction is the same as that of the defective address latch circuit ALC1 with one memory cell M1 connected thereto and that of the defective address latch circuit ALC2 with one memory cell M2 connected thereto.

Figure 3A:
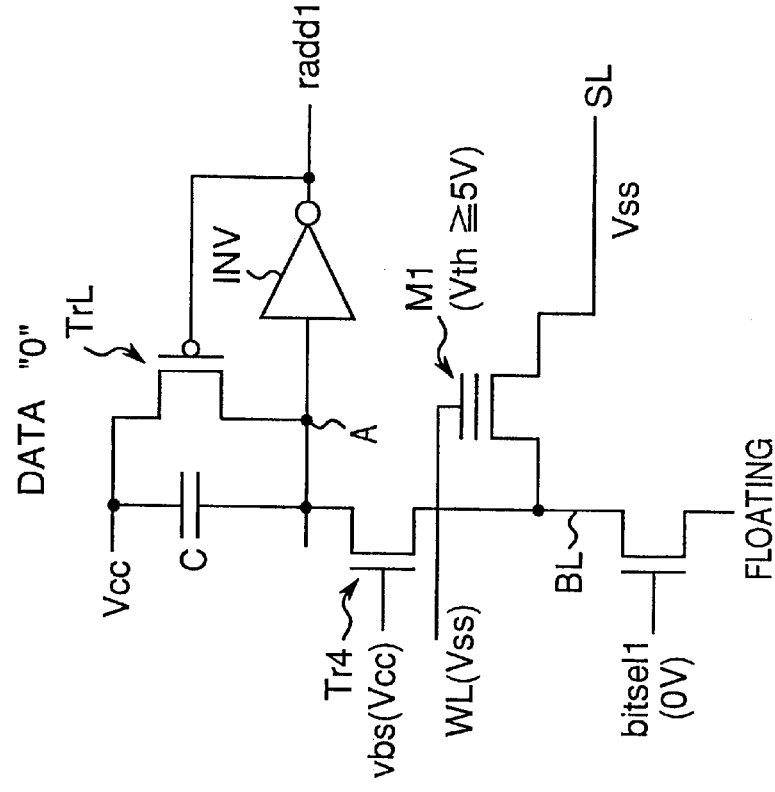
FIG. 3A is an explanatory view for explaining how the basic cell latches data "1"
Figure 3B:
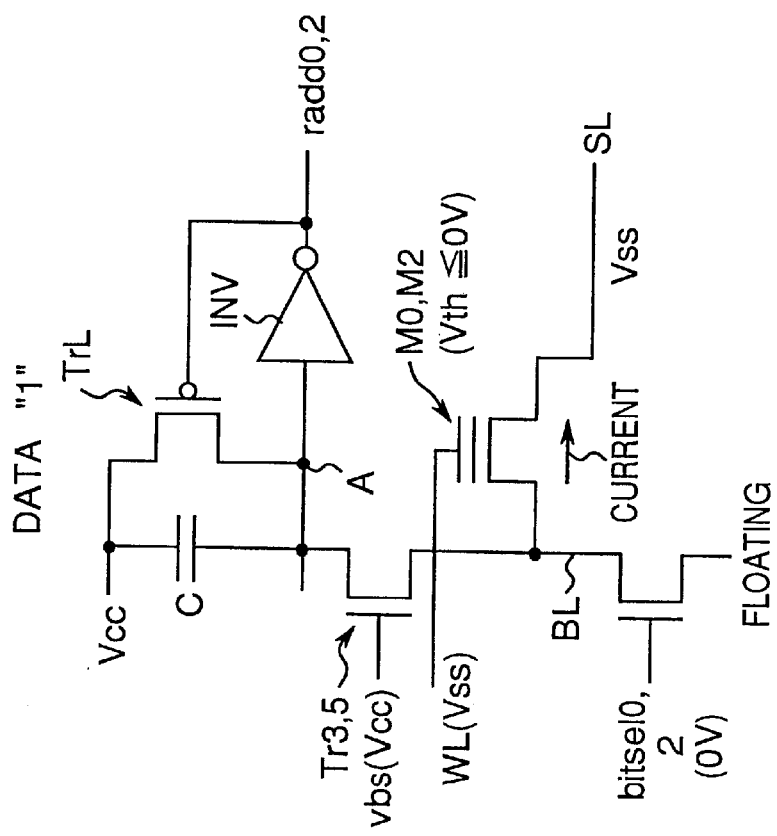
FIG. 3B is an explanatory view for explaining how the basic cell latches data "0"

The start operation of the defective address latch circuits ALC0, ALC1, and ALC2 when the power is turned on will be described below with reference to FIGS. 3 and 4. In the first embodiment, the bit selection signal lines bitsel0, bitsel1, and bitsel2 have the ground-side potential Vss (for example, 0 volts), so that the N-MOS transistors Tr0, Tr1, and Tr2 are off. Because signals supplied to the gates of the N-MOS transistors Tr3, Tr4, and Tr5 have the supply voltage Vcc, upon the rise of the power supply the N-MOS transistors Tr3, Tr4, and Tr5 are all turned on. The ground-side potential Vss (0 volts) is applied to the source line SL commonly connected to the sources of the memory cells M0, M1, and M2.

The operation of the defective address latch circuit ALC1 connected to the memory cell M1 storing the defective address information "0" will be described below.

In the first embodiment, the memory cells M0, M1, and M2 each have a threshold voltage, Vth, of 0 volts or less (an erased state) or a threshold of 5 volts or more (a programmed or written state). Accordingly, to read the memory cells M0, M1, and M2, the ground-side potential Vss (the reference voltage) should be applied to the word line WL. As shown in FIG. 4B, on switch-on, following the uprising of the supply voltage Vcc of 1.8 volts, the potential of the node A rises through the capacitor C. Thereby, a voltage of (Vcc−Vt) is applied to the bit line BL1 shown in FIG. 3B, namely, to the drain of the memory cell M1, were Vt represents a threshold voltage of the N-MOS transistor Tr4, and is for example, 0.7 volts. However, because the memory cell M1 is placed in the written state (Vth≧5V), electric current does not flow through the memory cell M1. Therefore, the potential of the node A rises and the output of an inverter circuit INV falls to an L level. Thereby, in FIG. 3B, the P-MOS transistor TrL is turned on, and the potential of the node A is fixed to the Vcc level. Therefore, the output radd1 of the inverter circuit INV is latched in the L level.

The memory cells M0 and M2 storing the data "1" of the defective address information are placed in the erased state (Vth≦0 volts). As described previously, the ground-side potential Vss (for example, 0 volts) is applied to the word line WL and the source line SL. The threshold of each of the memory cells M0 and M2 is 0 volts or less. Thus, with ground-side potential Vss applied to the word line WL and with the supply voltage Vcc exceeding the threshold Vt (0.7 volts) of the N-MOS transistors Tr3 and Tr5 so that the potential of the bit lines BL0 and BL2 exceeds 0 volts, electric current flows through the memory cells M0 and M2.

Figure 4A:
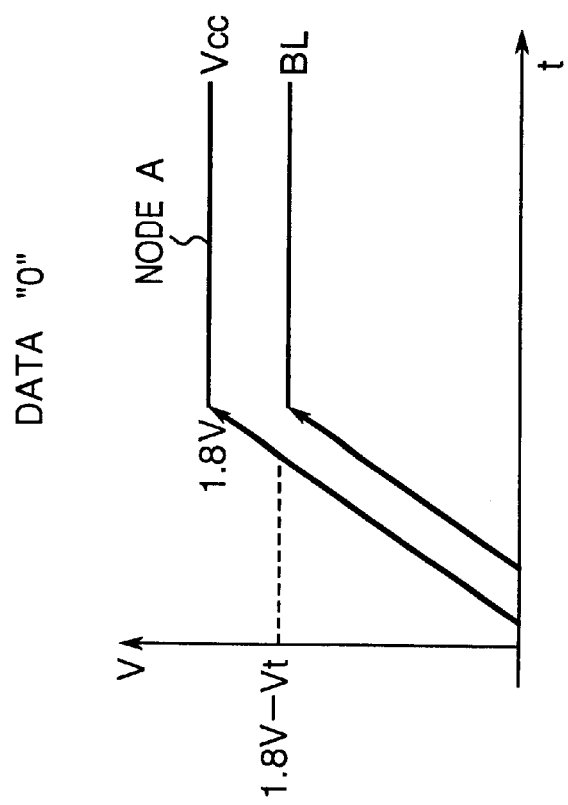
FIG. 4A is a voltage waveform chart of the defective address latch circuit corresponding to FIG. 3A.
Figure 4B:
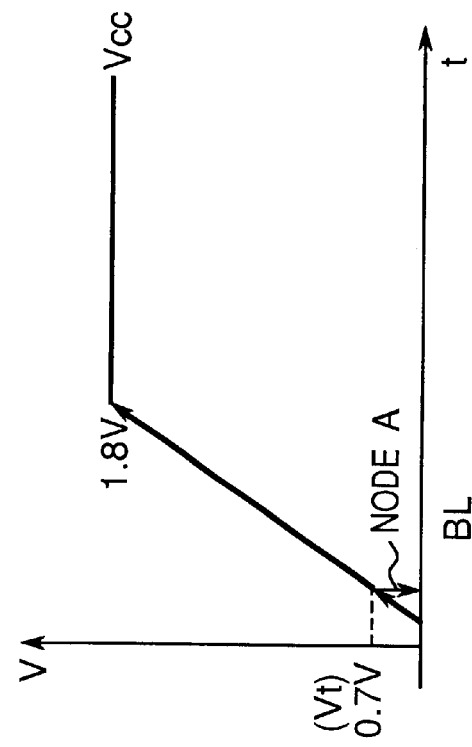
FIG. 4B is a voltage waveform chart of the defective address latch circuit corresponding to FIG. 3B.

That is, as shown in FIG. 4A, once the supply voltage Vcc starts to rise, the potential of the node A also starts to rise through the capacitor C. However, when the supply voltage Vcc exceeds the threshold Vt, electric circuit flows through the memory cells M0 and M2 and the node A goes to the potential of L level (Vt level). Accordingly, the output of the inverter circuit INV is the H level, and the P-MOS transistor is off. Therefore, the output radd0, radd2 of the inverter circuit INV is latched in the H level.

As apparent from the description, in the first embodiment, when the supply voltage Vcc exceeds the threshold, Vt (0.7 volts), of the N-MOS transistors Tr3 and Tr5 during the uprising of the supply voltage Vcc, the defective address latch circuits ALC0 and ALC2 operate normally. It is noted that the threshold of the P-MOS transistor TrL is −0.7 volts or more.

When the threshold of the N-MOS transistors Tr3 and Tr5 is 0.5 volts owing to alteration of the process condition or the like, the defective address latch circuits ALC0 and ALC2 operate normally when the supply voltage Vcc rises up to a voltage of 0.5 volts or more. In this case, the threshold of the P-MOS transistor TrL is required to be −0.5 volts or more.

The operable limit of a CMOS circuit (for example, inverter circuit INV used in the defective address latch circuit ALC) is 0.7 volts, with the threshold of the N-MOS transistor being 0.7 volts and the threshold of the P-MOS transistor −0.7 volts. Accordingly, in the first embodiment, it is possible to realize the defective address latch circuit operable up to the operable limit of the CMOS circuit, namely, operable at a low voltage without being affected by the threshold of the memory cell. In the first embodiment, it is possible to reduce the supply voltage at which the defective address latch circuit is operable, to the threshold Vt of the N-MOS transistor.

(Second Embodiment)

Figure 7:
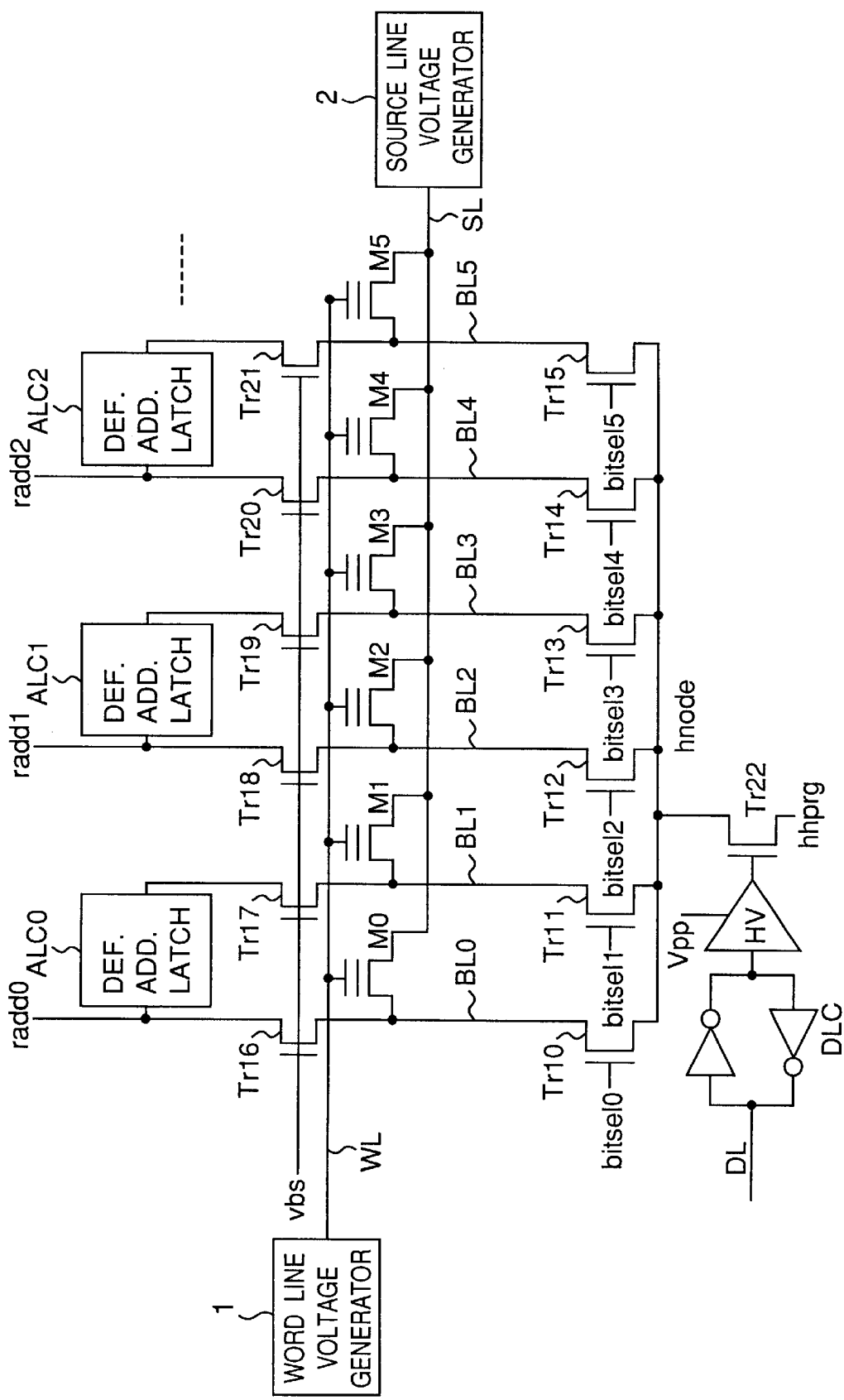
FIG. 7 is a circuit diagram showing second, third, and fourth embodiments of the present invention.

FIG. 7 shows a second embodiment of the present invention. The second embodiment is different from the first embodiment in that two memory cells M0 and M1 are connected to the defective address latch circuit ALC0, two memory cells M2 and M3 are connected to the defective address latch circuit ALC1, and two memory cells M4 and M5 are connected to the defective address latch circuit ALC2.

The circuit of the second embodiment has the defective address latch circuits ALC0, ALC1, and ALC2 and memory cells M0, M1, M2, M3, M4, and M5. A control gate of each of the memory cells M0, M1, M2, M3, M4, and M5 is connected to a word line WL and a source of each memory cell is connected to a source line SL. The word line WL and the source line SL are connected to the word line voltage generator 1 having the circuit construction shown in FIG. 27 and the source line voltage generator 2 having the circuit construction shown in FIG. 28 respectively. Drains of the memory cells M0, M1, M2, M3, M4, and M5 are connected to bit lines BL0, BL1, BL2, BL3, BL4, and BL5, respectively. The bit lines BL0, BL2, and BL4 are connected to the defective address latch circuits ALC0, ALC1, and ALC2 through transistors Tr16, Tr18, and Tr20. The bit lines BL1, BL3, and BL5 are connected to the defective address latch circuits ALC0, ALC1, and ALC2 through transistors Tr17, Tr19, and Tr21. The defective address latch circuits ALC0, ALC1, and ALC2 are connected to outputs radd0, radd1, and radd2, respectively.

The bit lines BL0 through BL5 are connected to an hnode line via transistors Tr10 through Tr15, respectively. The hnode line is connected to an hhprg line via a transistor 22. The gate of the transistor Tr22 is connected to an output side of a high-voltage level shifter HV. An input side of the high-voltage level shifter HV is connected to a data line DL via a write data latch circuit DLC. The write data latch circuit DLC has the same construction as that of the write data latch circuit DLC of the fist embodiment.

Figure 8:
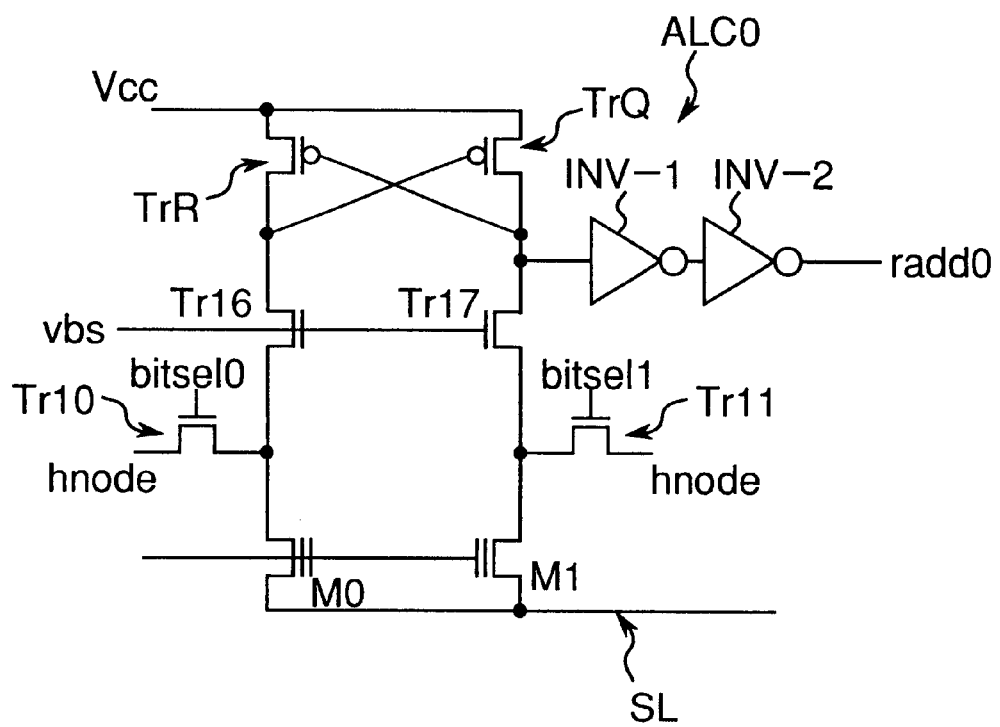
FIG. 8 is a circuit diagram of a basic cell constructed of a defective address latch circuit ALC0 and memory cells M0 and M1 in the second embodiment.

FIG. 8 shows the construction of a circuit, of the memory device, including one defective address latch circuit ALC0 and two memory cells M0 and M1. As shown in FIG. 8, the defective address latch circuit ALC0 has two p-MOS transistors TrQ and TrR and two inverters INV-1 and INV-2. The gate of the transistor TrQ is connected to the drain of the transistor TrR. The gate of the transistor TrR is connected to the drain of the transistor TrQ. The source of each of the transistors TrQ and TrR is connected to a line of a supply voltage Vcc. The drain of the transistor TrQ is connected to the transistor Tr17. The line connecting the transistor Tr17 and the drain of the transistor TrQ is connected to a series circuit of the inverters INV-1 and INV-2. The output side of the inverter INV-2 is the output radd0 of the defective address latch circuit ALC0.

Similar to the first embodiment, in the second embodiment, the initial state of the threshold of the memory cell M connected to the defective address latch circuit ALC which has latched the data "0" is set to a voltage of 0 volts or less.

The operation of the second embodiment is described below.

Initially, the threshold of each of the memory cells M0 and M1, M2 and M4, and M4 and M5 connected to the address latch circuits ALC0, ALC1, and ALC2, respectively is lowered. In the second embodiment, for brief description, only six memory cells (M0 through M5) equivalent to three bits of defective address information are used as an example.

Lowering the threshold of each of the memory cells M0 through M5 means extraction of electrons from a floating gate of each memory cell. The extraction of the electrons may be executed as a write operation or as an erase operation. Whether the extraction of the electrons is executed as the write operation or as the erase operation depends on the initial state of the memory cell. In the second embodiment, the extraction of the electrons will be described as an erase operation.

The data of the memory cells M0 and M1, M2 and M4, and M4 and M5 connected to the address latch circuits ALC0, ALC1, and ALC2 are erased as follows. Initially, similarly to the first embodiment, the word line voltage generator 1 applies a negative high voltage (for example, −9 volts) to the word line WL connected to the control gate of each of the memory cells M0 through M5. Then, the source line voltage generator 2 applies a positive high voltage (for example, 6 volts) to the source line SL commonly connected to the source of each of the memory cells M0 through M5. On the other hand, a control signal line vbs and bit selection signal lines bitsel0 through bitsel5 each have an L level. Thus, the N-MOS transistors Tr0 through Tr21, to which the L-level signals are supplied at the gates thereof, are off. Accordingly, the bit lines BL0 through BL5 to which the drains of the memory cells M0 through M5 are connected have a high-impedance state. That is, each drain is placed in a floating state.

As a result, at the source side of the memory cells M0 through M5, electrons are extracted from the floating gate thereof, and the thresholds of the memory cells M0 through M5 are reduced. After the voltages for erasure are applied to the word line and the source line in the erase operation, whether the thresholds Vth of all the memory cells M0 and M1, M2 and M4, and M4 and M5 connected to the address latch circuits ALC0, ALC1, and ALC2, respectively have become a voltage of 0 volts or less is verified.

The verify operation is performed in the following manner. Initially, the ground-side potential Vss (for example, 0 volts) is applied to the word line WL. Then, the bit selection signal line bitsel0 is set to an H level (for example, 1.8 volts) so that the N-MOS transistor Tr10 conducts. The ground-side potential Vss (for example, 0 volts) is applied to the source line SL commonly connected to the sources of the memory cells M0 through M5. One volt is applied to a node hnode to which a sense amplifier (not shown) is connected. It is detected whether or not an electric current flows through the memory cell M0, by the comparison with a set reference voltage at the sense amplifier. If it is determined that electric current flows therethrough, it is concluded that the memory cell M0 is placed in an erased state (namely, Vth≦0 volts).

Then, the verify operation is performed for each of the memory cells M1 through M5 sequentially. If it is determined that the thresholds of all the memory cells are 0 volts or less, it is determined that the erase operation is successfully completed. If even one memory cell having a threshold voltage of more than 0 volts is detected, the voltages for erasure are applied again to the circuit. In this manner, the erase and verify operations are repeatedly executed until the thresholds of all the memory cells become 0 volts or less.

FIG. 15 shows the thresholds of the memory cells placed in the erased state and the distribution thereof. Upon completion of the erase operation, the thresholds of all the memory cells M0–M5 connected to the address latch circuits ALC0–ALC2 are distributed in the range between 0 volts and −2.5 volts.

The method of storing (writing) a defective address in the memory cell placed in the threshold-reduced state will be described below. Writing is performed by using channel hot electrons. The operation of writing data "101" as the defective address to the memory cells will be described below. The data "101" is transmitted serially. Initially, an H level (Vcc level) signal corresponding to data "1" is supplied to the data line DL. Then, an L-level signal, namely, data inverse to the data "1" is supplied to the data line DL. The proper data "1" is data to be stored in the memory cell M0, whereas the inverse data "0" is data to be stored in the memory cell M1. The proper data "1" on the data line DL is latched by the write data latch circuit DLC and becomes an L-level (Vss level) signal.

Then, the L-level signal, after processed in the high-voltage level shifter Hv whose construction is shown in FIG. 6, sets the gate of the N-MOS transistor Tr22 to an L level (Vss level). Thereby, the N-MOS transistor Tr22 is turned off. To write the proper data "1" to the memory cell M0, the potential Vpp (for example, 10 volts) is applied to the word line WL. The potential Vpp is also applied to the bit selection signal line bisel0. Although not shown, the high-voltage level shifter HV is connected to the bit selection signal line bisel0. Thereby, the N-MOS transistor Tr10 is turned on while the N-MOS transistors Tr11 through Tr15 remain off. At this time, the transistor Tr22 is off. Thus, the bit line BL0 is in a high-impedance state. That is, the drain of the memory cell M0 is floating. Accordingly, although the potential Vpp is applied to the word line WL and the ground-side potential Vss (for example, 0 volts) is applied to the source line SL, writing to the memory cell M0 is not executed. Thus, the threshold of the memory cell M0 is maintained at a low voltage (Vth≦0 volts).

Then, the L-level signal corresponding to the data "0" inverse to the data "1" is supplied to the data line DL. As a result, the write data latch circuit DLC is inverted in its output and latches the H-level signal. The data "0" is to be stored in the memory cell M1. The H-level signal is shifted to the Vpp level by the high-voltage level shifter Hv. The Vpp level signal turns on the N-MOS transistor Tr22. Then, as described previously, the word line WL becomes the Vpp level and the next bit selection signal line bisel1 also becomes the Vpp level to thus turn on the N-MOS transistor Tr11 connected to the bit line BL1 for the memory cell M1. At this time, the N-MOS transistors Tr10 and Tr12 through Tr15 are off.

Accordingly, a voltage hhprg (for example, 6 volts) is applied to the drain of the memory cell M1 via the bit line BL1. The ground-side potential Vss (for example, 0 volts) is applied to the common source line SL. Thereby, writing is executed to the memory cell M1 by using the channel hot electrons. That is, electrons are injected to the floating gate of the memory cell from its drain side. As a result, the threshold of the memory cell M1 rises to a voltage of 5 volts or more. As in the case of the erase operation, write and verify operations are executed alternately until the threshold of the memory cell has been set to a predetermined one. FIG. 15 shows the threshold of the memory cell placed in the written state (programmed state) and the distribution of the thresholds. The threshold of the memory cell M1 is 5 volts or more after writing has been executed thereto.

Then, the L-level signal corresponding to the proper data of the subsequent data "0" is supplied to the data line DL. The data "0" is to be stored in the memory cell M2. The data "0" on the data line DL is supplied to the write data latch circuit DLC. The write data latch circuit DLC is inverted in its output, latching an H-level signal. The H-level signal is shifted to the Vpp level by the high-voltage level shifter Hv. The Vpp level signal turns on the N-MOS transistor Tr22. Then, as described previously, the word line WL becomes the Vpp level and now the bit selection signal line bisel2 also becomes the Vpp level to thus turn on the N-MOS transistor Tr12 connected to the bit line BL2 for the memory cell M2. At this time, the N-MOS transistors Tr10–Tr11 and Tr13–Tr15 are off. Accordingly, the voltage hhprg (for example, 6 volts) is applied to the drain of the memory cell M2 via the bit line BL2.

At this time, the ground-side potential Vss (for example, 0 volts) is being applied to the common source line SL. Thus, writing is executed to the memory cell M2 by using the channel hot electrons. That is, electrons are injected to the floating gate of the memory cell from its drain side. As a result, the threshold of the memory cell M2 increases to a voltage of 5 volts or more. At this time, as in the case of the erase operation, write and verify operations are executed alternately until the threshold of the memory cell has been set to a predetermined one. FIG. 15 shows the threshold of the memory cell placed in the written state (programmed state) and the distribution of the thresholds. The threshold of the programmed memory cell M1 is 5 volts or more.

Then, the H-level signal corresponding to the inverse data of the data "0" to be stored in the subsequent memory cell M3 is supplied to the data line DL. The H-level signal is latched into the write data latch circuit DLC and becomes the L-level (Vss level) signal. Then, through the high-voltage level shifter Hv, the L-level (Vss level) signal turns off the N-MOS transistor Tr22 and sets the gate of the N-MOS transistor Tr19 to the L level (Vss level).

To write the data "0" to the memory cell M3, the potential Vpp (for example, 10 volts) is applied to the word line WL. The potential Vpp is also applied to the bit selection signal line bisel3. Thereby, the N-MOS transistor Tr13 is turned on, while the N-MOS transistors Tr10, Tr11, Tr12, Tr14, and Tr15 remain off. At this time, the transistor Tr22 is off. Thus, the bit line BL3 has the high-impedance state. That is, the drain of the memory cell M3 has the floating state.

Accordingly, although the potential Vpp is applied to the word line WL, and the ground-side potential Vss (for example, 0 volts) is applied to the source line SL, writing to the memory cell M3 is not executed. Thus, the threshold of the memory cell M3 is maintained at a low voltage (Vth≦0 volts).

Then, an L-level signal corresponding to the data "1" is supplied to the data line DL. Then, an H-level signal corresponding to the inverse data "0" is supplied to the data line DL.

As described previously, owing to the data "1" and "0", the threshold, Vth, of the memory cell M4 is maintained at a low voltage (Vth≦0 volts), while programming of the memory cell M5 is executed, with its threshold increased to 5 volts or more.

In this manner, the defective address information "101" is stored in the memory cells M0 and M1, M2 and M4, and M4 and M5 connected to the address latch circuits ALC0, ALC1, and ALC2, respectively.

In using the nonvolatile semiconductor memory device of the second embodiment including the circuitry shown in FIG. 7, upon turn-on of the power supply, the supply voltage Vcc (e.g., 1.8 volts) is applied to the control signal line vbs, and the N-MOS transistors Tr16–Tr21 are turned on upon the rise of the supply voltage Vcc. Thereby, data written to the memory cells M0 and M1, M2 and M4, and M4 and M5 are latched by the address latch circuits ALC0, ALC1, and ALC2, respectively. The second embodiment adopts the storing method by which one bit of defective address information is stored by two memory cells different in threshold.

The start operation of the defective address latch circuit when the power is turned on will be described below with reference to FIGS. 9A, 9B, 10A and 10B. At this time, the bit selection signal lines bitsel0 through bitsel5 are at the ground-side potential Vss (for example, 0 volts) level, so that the N-MOS transistors Tr10 through Tr15 are off. Because signals supplied to the gates of the N-MOS transistors Tr16 through Tr21 have the supply voltage Vcc, once the power supply has risen, all of the N-MOS transistors Tr16 through Tr21 are turned on. The ground-side potential Vss (for example, 0 volts) is applied to the source line SL commonly connected to the sources of the memory cells M0, M1, and M2.

Figure 9A:
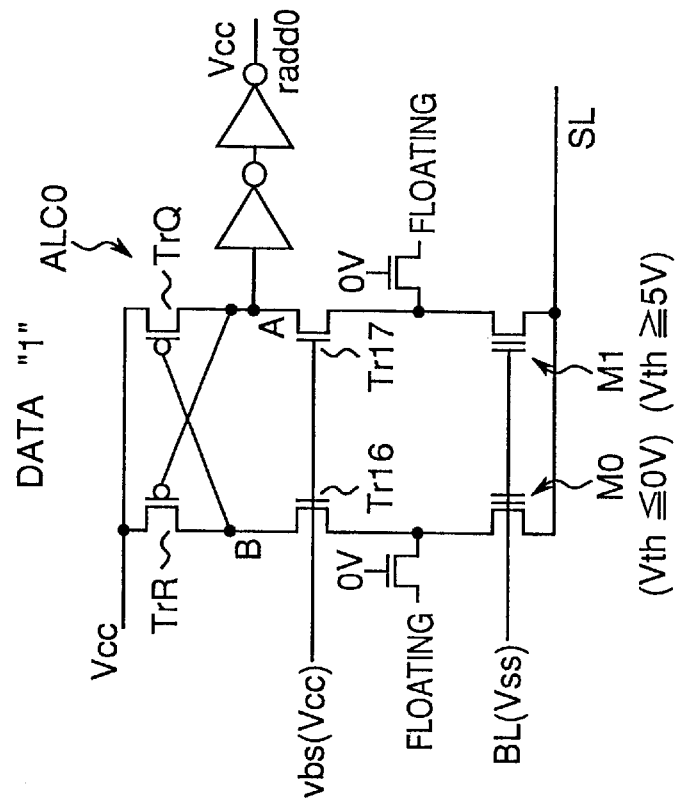
FIG. 9A is an explanatory view for explaining how the basic cell latches data "1"

With reference to FIG. 9A, the operation of the defective address latch circuit ALC1 connected to the memory cells M2 and M3 storing the defective address information "0" will be described below. In the second embodiment, the threshold, Vth, of the memory cell is 0 volts or lower (erased state) or 5 volts or more (programmed state). Accordingly, to read the memory cell, the ground-side potential Vss (for example, 0 volts) should be applied to the word line WL. As shown in FIG. 10A, the power is turned on and the supply voltage Vcc (for example, 1.8 volts) rises. When the supply voltage Vcc exceeds the threshold Vt (for example, 0.7 volts) of the N-MOS transistor, the N-MOS transistors Tr18 and Tr19 are turned on. Thereby, electric current flows through the memory cell M3 (whose threshold, Vth, is 0 volts or lower) and the node A becomes an L level. As a result, the P-MOS transistor TrR of the defective address latch circuit ALC1 is turned on. However, because electric current does not flow through the memory cell M2 (whose threshold, Vth, is 5 volts or more), the potential of the node B is fixed to the H level (1.8 volts). Therefore, the output radd1 after the two inverter circuits INV-1 and INV-2 is latched in the L level (Vss, for example, 0 volts).

Figure 9B:
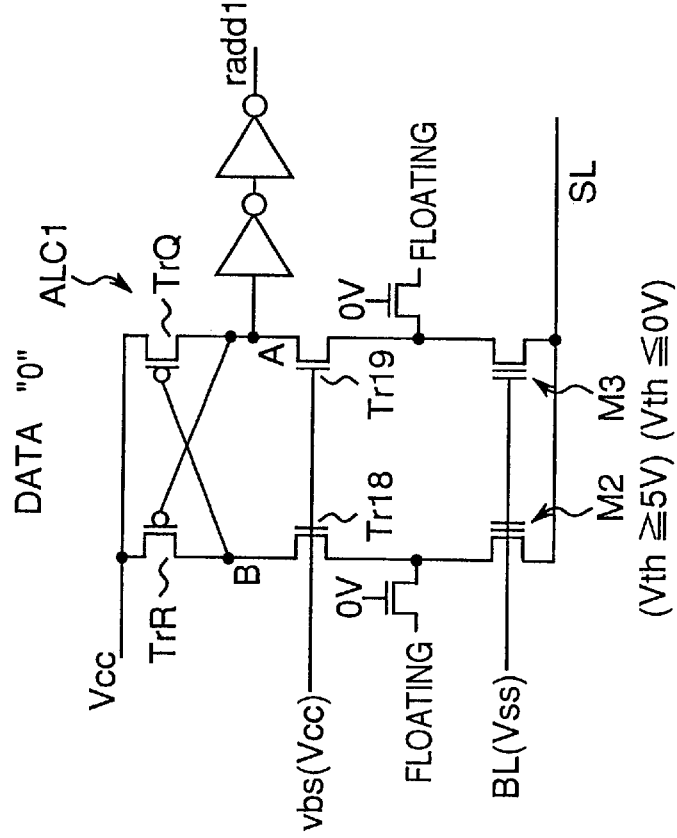
FIG. 9B is an explanatory view for explaining how the basic cell latches data "0"
Figure 10B:
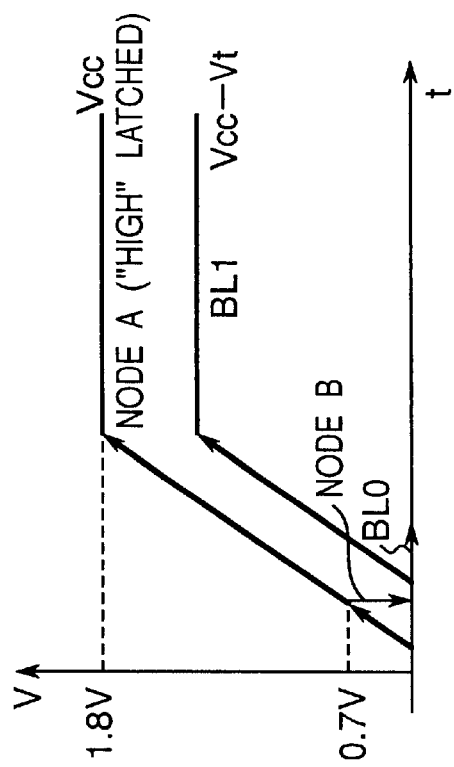
FIG. 10B is a voltage waveform chart of the defective address latch circuit corresponding to FIG. 9B.
Figure 10A:
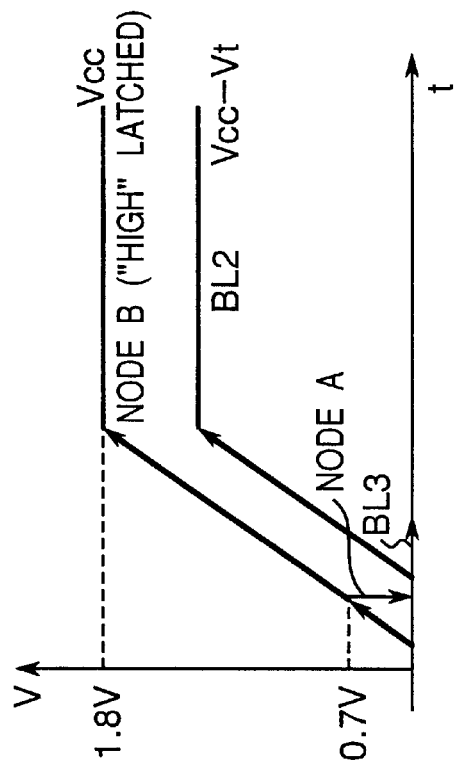
FIG. 10A is a voltage waveform chart of the defective address latch circuit corresponding to FIG. 9A.
Figure 11A:
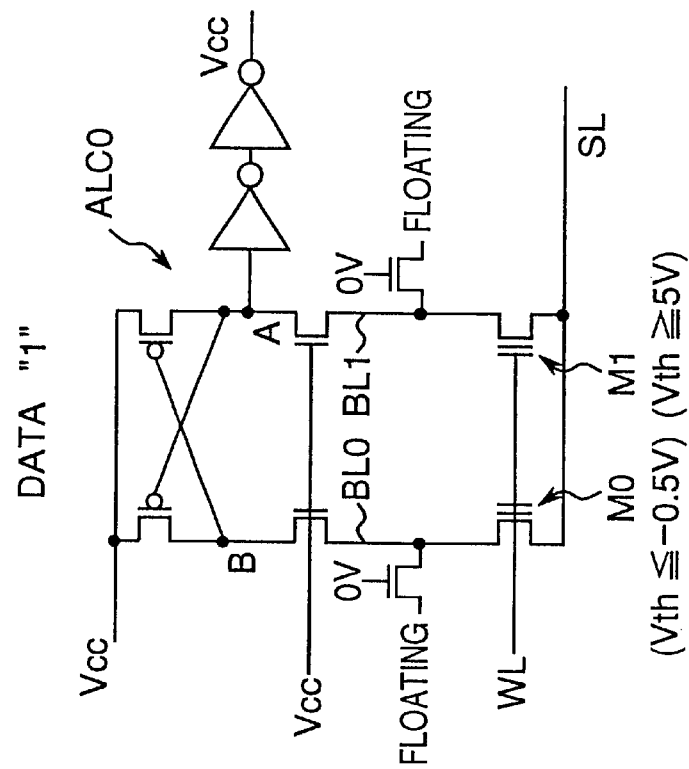
FIG. 11A is an explanatory view for explaining how a basic cell, constructed of a defective address latch circuit ALC0 and memory cells M0 and M1, in the third embodiment of the present invention latches data "0"
Figure 11B:
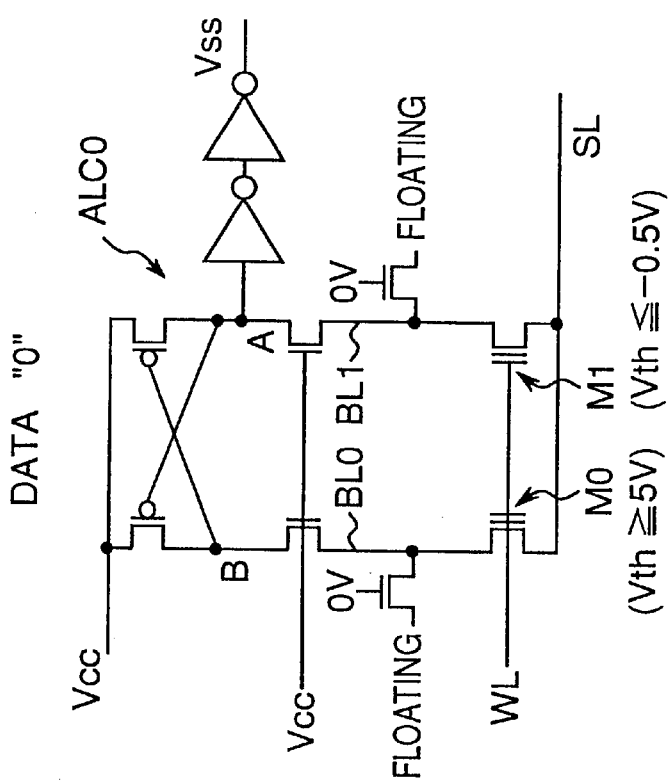
FIG. 11B is an explanatory view for explaining how the basic cell latches data "1"
Figure 12A:
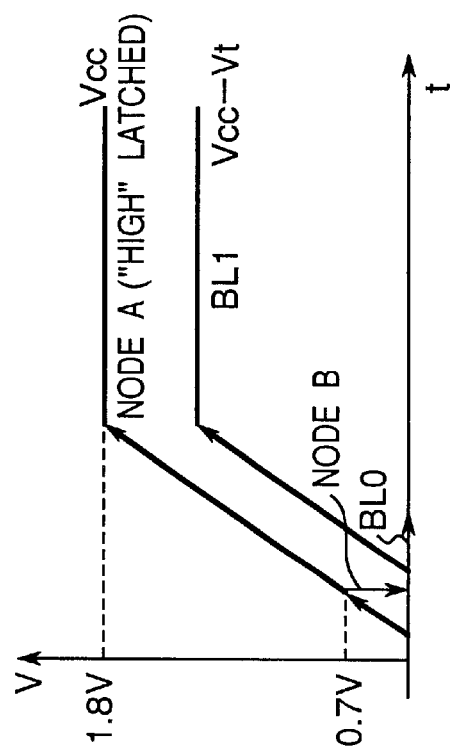
FIG. 12A is a voltage waveform chart of the defective address latch circuit corresponding to FIG. 11A.
Figure 12B:
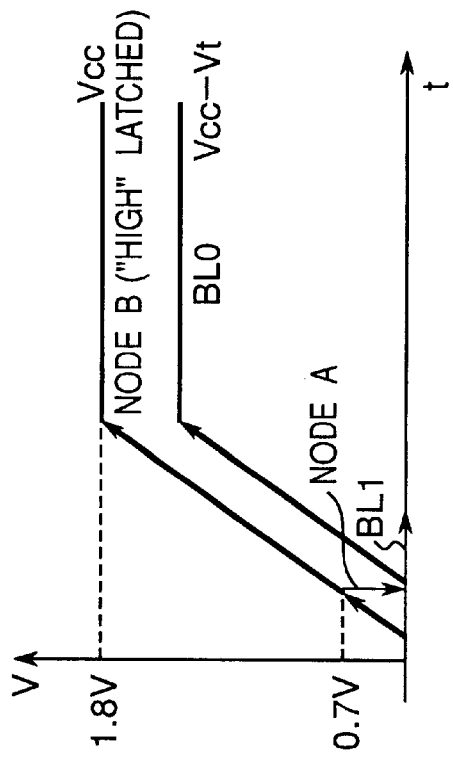
FIG. 12B is a voltage waveform chart of the defective address latch circuit corresponding to FIG. 11B.

With reference to FIGS. 9B and 10B, the operation of the defective address latch circuit ALC0 connected to the memory cells M0 and M1 storing the defective address information "1" will be described next. As already stated, in the second embodiment, the threshold, Vth, of the memory cell is 0 volts or lower (erased state) or 5 volts or more (programmed state). Accordingly, to read the memory cell, the ground-side potential Vss (for example, 0 volts) should be applied to the word line WL.

As shown in FIG. 10B, the power is turned on and the supply voltage Vcc (for example, 1.8 volts) rises. When the supply voltage Vcc exceeds the threshold Vt (for example, 0.7 volts) of the N-MOS transistors, the N-MOS transistors Tr16 and Tr17 are turned on. Thus, electric current flows through the memory cell M0 (whose threshold, Vth, is 0 volts or lower) and the node B becomes an L level. As a result, the P-MOS transistor TrQ is turned on. On the other hand, because electric current does not flow through the memory cell M1 (whose threshold, Vth, is 5 volts or more), the potential of the node A is fixed to the H level (1.8 volts).

Therefore, the level H (Vcc: 1.8 volts) is latched in the output radd0 through the two inverter circuits INV-1 and INV-2. This also applies to the output radd2.

As is obvious from the above description, in the second embodiment, once the supply voltage Vcc exceeds the threshold Vt of the N-MOS transistor during the uprising of the supply voltage Vcc, the defective address latch circuit operates normally. In the described example, the threshold of the N-MOS transistor is 0.7 volts or more. In this case, the threshold of the P-MOS transistor should be −0.7 volts or more.

The second embodiment adopts the scheme in which the two associated memory cells having different thresholds are connected to the defective address latch circuit. This scheme provides a stable output.

When the threshold, Vt, of the N-MOS transistors Tr10 through Tr21 is 0.5 volts owing to alteration of the process condition or the like, the defective address latch circuits ALC operates normally when the supply voltage Vcc rises up to a voltage of 0.5 volts or more. In this case, the threshold of the P-MOS transistor should be −0.5 volts or more.

Generally, the operable limit of a CMOS circuit (for example, inverter circuit INV used in the defective address latch circuit ALC) is 0.7 volts, with the threshold of the N-MOS transistor being 0.7 volts and the threshold of the P-MOS transistor −0.7 volts. Accordingly, in the second embodiment, it is possible to realize the defective address latch circuit operable up to the operable limit of the CMOS circuit, namely, operable at a low voltage without being affected by the thresholds of the memory cells. In the second embodiment, it is possible to reduce the supply voltage at which the defective address latch circuit is operable, even to the threshold Vt of the N-MOS transistors.

(Third Embodiment)

A third embodiment of the present invention will be described below.

In the first and second embodiments, when the memory device is powered on and performs an operation, the word line WL of the flash memory storing the defective address to be latched in the defective address latch circuits ALC0, ALC1, and ALC2 has the ground-side potential (for example, 0 volts). In this case, if the threshold of s memory cell is in the vicinity of 0 volts, electric current of as low as 1 μA flows through the memory cell because the voltage of the word line WL is 0 volts. Thus, it may take a considerable time for the defective address latch circuit to be completely definite. Further, the memory device may malfunction if a command is issued before the defective address latch circuit is completely definite.

The third embodiment is intended to solve the problem.

The circuit for storing an address using a nonvolatile semiconductor memory, according to the third embodiment, will be described with reference to FIG. 7. The initial operation to be executed in the third embodiment is to reduce the threshold of the memory cells M0 and M1, M2 and M4, and M4 and M5 connected to the address latch circuits ALC0, ALC1, and ALC2, respectively.

The third embodiment is different from the first and second embodiments in that the threshold of the memory cell after the erase operation has been executed is lower in the third embodiment than in the first and second embodiments. Lowering of the threshold is performed as the erase operation but may be performed as the programming operation.

The erase operation of the third embodiment is described below. In the erase operation, initially, a negative high voltage (for example, −9 volts) is applied to the word line WL shown in FIG. 7. Then, a positive high voltage (for example, 6 volts) is applied to the source line SL shown in FIG. 7. At this time, the drain of each of the memory cells M0 through M5 is placed in a floating state. Thereby, at the source side of each of the memory cells M0 through M5, electrons are extracted from the floating gate thereof. As a result, the threshold of each memory cell decreases.

Then, a verify operation is performed to check whether all the memory cells M0–M5 connected to the address latch circuits ALC0, ALC1, and ALC2 have a negative threshold (e.g., Vth≦−0.5 volts).

In the verify operation, −0.5 volts is applied to the word line WL. Then, the potential Vcc (for example, 1.8 volts) is applied to the bit selection signal line bitsel0. Using a sense amplifier (not shown) connected to the node hnode continuous with the bit line BL0, it is detected whether electric current flows through the memory cell M0. If it is determined that electric current flows through the memory cell M0, it is concluded that the memory cell M0 is placed in the erased state (Vth≦−0.5 volts). Then, the verify operation is performed in the similar manner for each of the memory cells M1 through M5 sequentially. If it is determined that the thresholds, Vth, of all the memory cells are −0.5 volts or less, the erase operation is completed.

Figure 16:
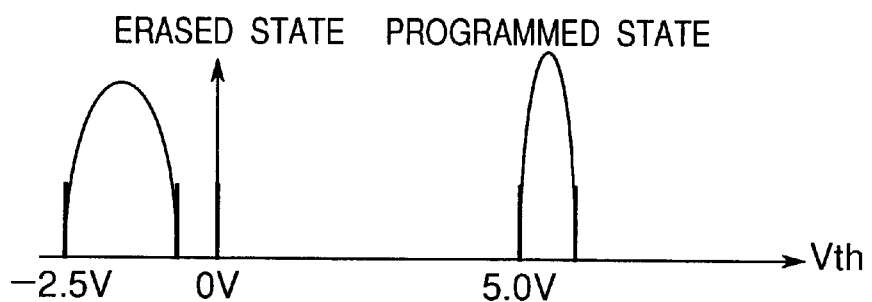
FIG. 16 shows threshold states of the memory cell in the third embodiment.

On the other hand, if it is detected that even one of the memory cells M0 through M5 has a threshold, Vth, of over −0.5 volts, pulses for erasure are applied again to the word line and the source line at the time of the detection and the application of such pulses lasts until the thresholds of all the memory cells M0 through M5 become −0.5 volts or less. FIG. 16 shows the state of the thresholds of the memory cells M0 through M5 in the third embodiment.

Although not described in detail here, the method of writing the data of the defective address in the third embodiment is similar to that of writing it in the second embodiment. That is, writing of the defective address data "101" is executed by using the channel hot electrons. In this case, the threshold is 5 volts or more in the programmed state in which the threshold is high, whereas in the erased state in which the threshold is low, the threshold is −0.5 volts or less.

The operation of the circuit of the present embodiment at the power-on of the device is as shown in FIGS. 11A, 11B, 12A, and 12B, which is similar to the operation in the second embodiment described with reference to FIGS. 9A, 9B, 10A, and 10B. In the third embodiment, however, the threshold of the memory cell in the low threshold state is max. −0.5 volts. Therefore, when the voltage of the word line WL of the memory cells M0 through M5 is set to the ground-side potential Vss, electric current of about 20 μA flows through the memory cell. That is, because electric current flows therethrough sufficiently, latched data of the defective address becomes definite instantly upon rise of the power supply. Accordingly, a malfunction does not occur even if a command is issued immediately after the rise of the supply voltage.

(Fourth Embodiment)

The fourth embodiment of the present invention is described below. The third embodiment described immediately before was intended to solve the problems of the first and second embodiments.

Figure 17:
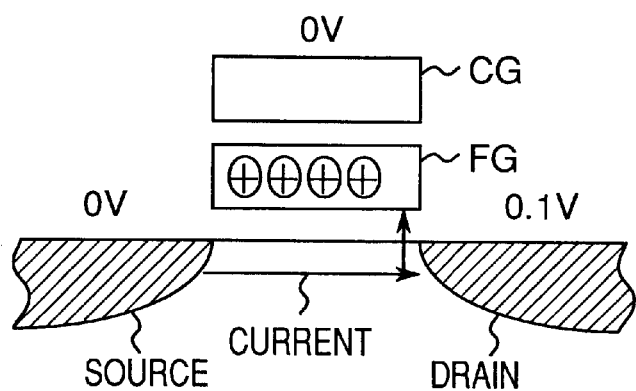
FIG. 17 shows a disturb of a memory cell taking place during the operation.
Figure 18:
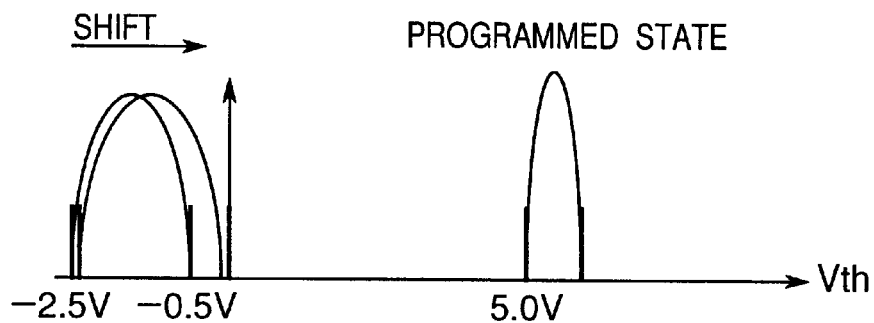
FIG. 18 shows the shift of the threshold caused by the disturb in the third embodiment.

However, in the existing ETOX flash memory, the threshold thereof is about 2 volts in a thermal equilibrium state. Thus, with the threshold of the memory cell set to a value of as low as −0.5 volts or below as in the third embodiment, in operation, application of a voltage to the bit line may cause an electric current to flow through memory cells. Then, disturb occurs and the threshold of the memory cells increase. This will be described below with reference to FIGS. 17 and 18. As shown in FIG. 17, with reduction of the threshold, a floating gate FG of a memory cell is charged with positive charges, electric current flows through a channel layer, and hot electrons are generated. The hot electrons are injected to the floating gate FG, with the result that the threshold in the erased state increases as shown in FIG. 18.

The fourth embodiment is intended to solve the problem. Similarly to the third embodiment, the fourth embodiment is described with reference to the circuit (which is a circuit for storing address using nonvolatile semiconductor memory cells) shown in FIG. 7. The content of the fourth embodiment is applicable to the circuit shown in FIG. 1 used to describe the first embodiment.

The initial operation to be executed in the fourth embodiment is to reduce the threshold, Vth, of the memory cells M0 and M1, M2 and M4, and M4 and M5 connected to the address latch circuits ALC0, ALC1, and ALC2, respectively. The fourth embodiment is different from the first and second embodiments in that after an erase operation has been executed, the memory cells in the fourth embodiment are higher in threshold than the memory cells in the first and second embodiments. In the fourth embodiment, the operation of reducing the threshold is performed as the erase operation but may be performed as the programming operation.

In connection with the fourth embodiment, the erase operation will be described next. In the erase operation, initially, a negative high voltage (for example, −9 volts) is applied to the word line WL shown in FIG. 7. Then, a positive high voltage (for example, 6 volts) is applied to the source line SL. At this time, the drain of each of the memory cells M0 through M5 is placed in the floating state. Thereby, at the source side of each of the memory cells M0 through M5, electrons are extracted from the floating gate thereof. As a result, the threshold of each memory cell decreases to be equal to or lower than the threshold, Vt, of each of the N-MOS transistor Tr10 through Tr21.

Figure 19:
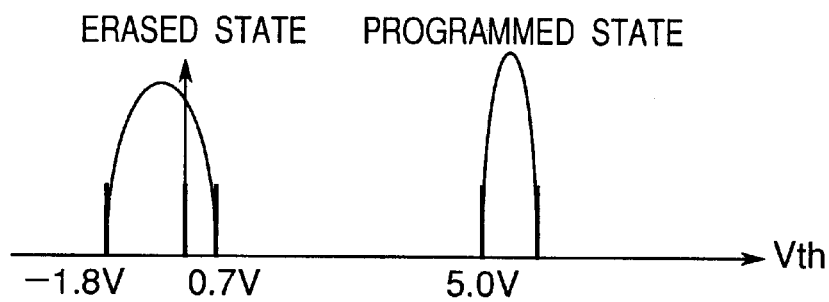
FIG. 19 shows threshold states of the memory cell of the fourth embodiment.
Figure 20:
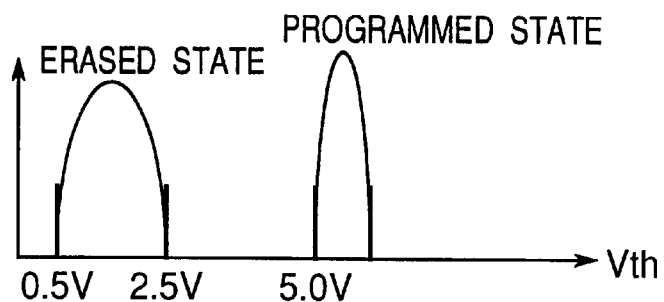
FIG. 20 shows threshold states of a memory cell according to first and second related background arts.
Figure 21B:
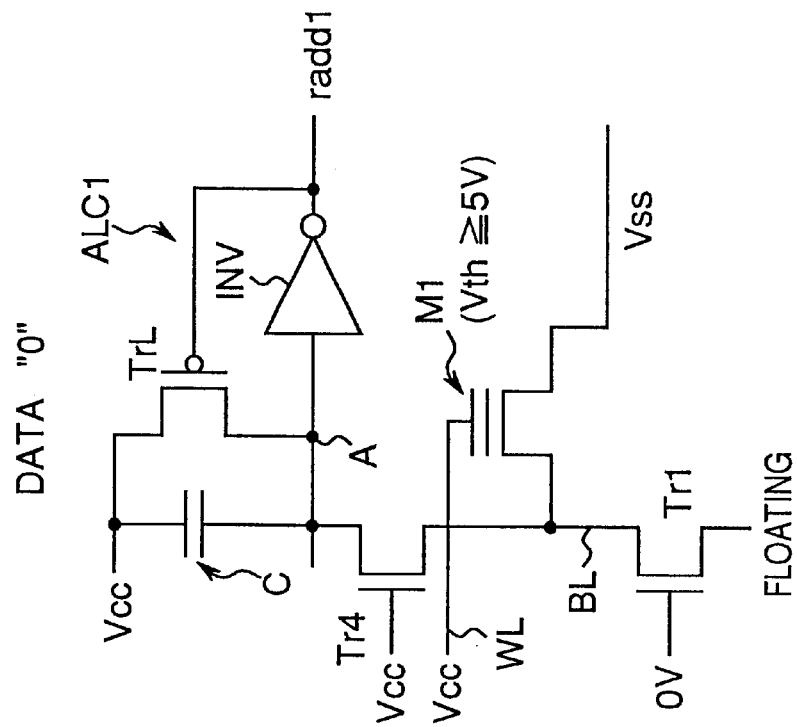
FIG. 21B is an explanatory view for explaining how to latch data "0" by the defective address latch circuit.
Figure 21A:
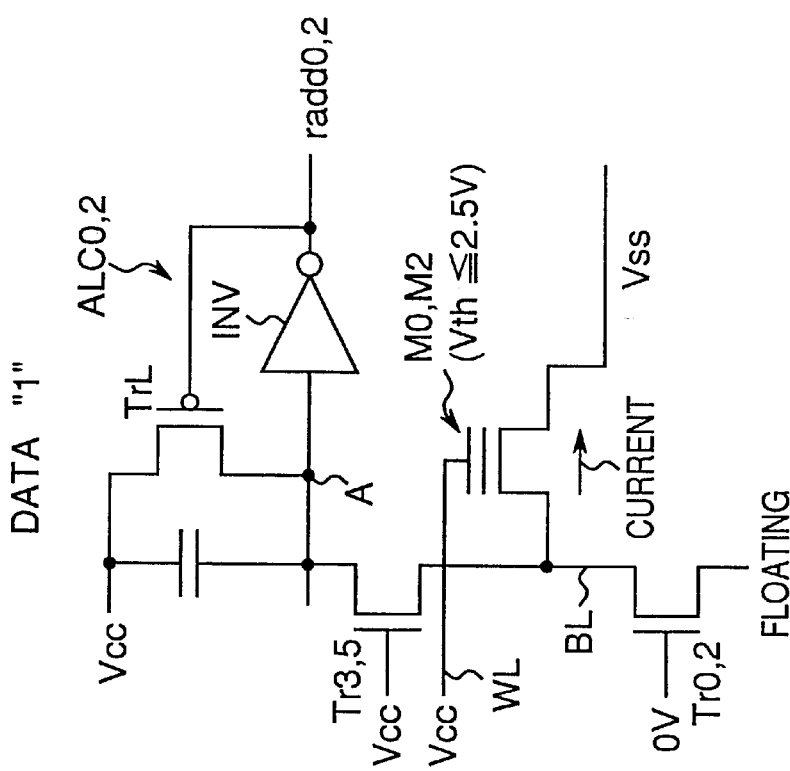
FIG. 21A is an explanatory view for explaining how to latch data "1" by a defective address latch circuit in the first related background art.
Figure 22B:
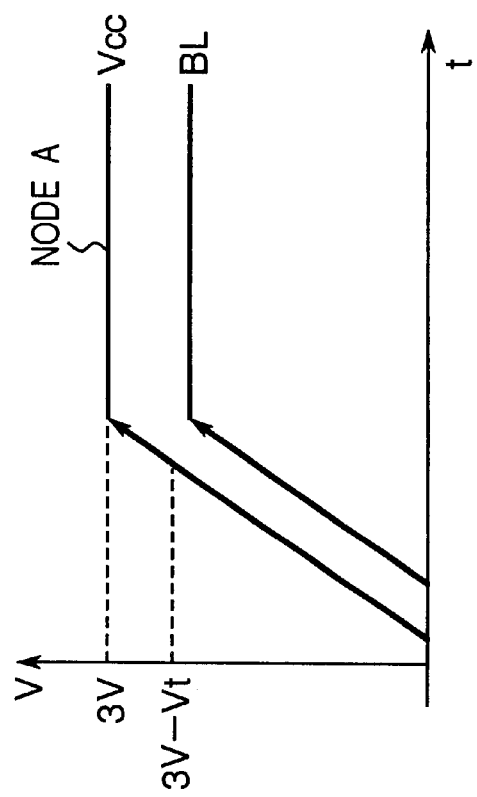
FIG. 22B is a voltage waveform chart of the defective address latch circuit corresponding to FIG. 21B.
Figure 22A:
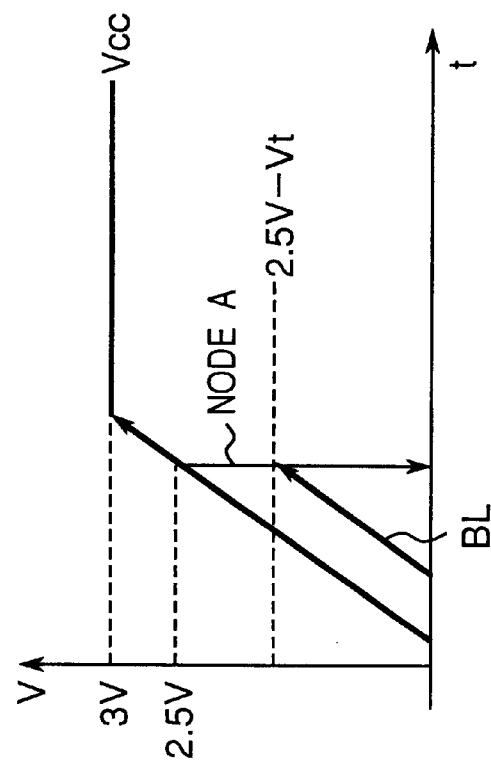
FIG. 22A is a voltage waveform chart of the defective address latch circuit corresponding to FIG. 21A.
Figure 23B:
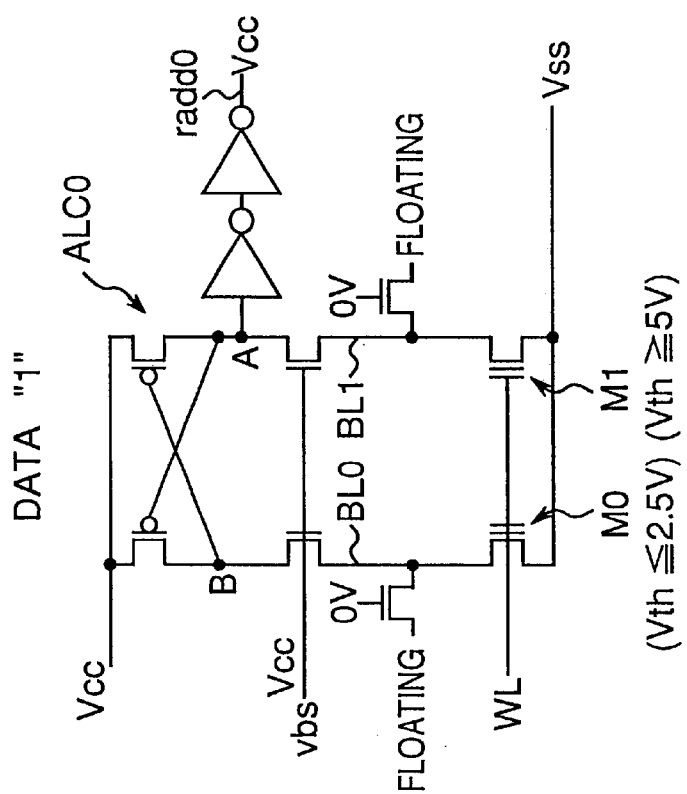
FIG. 23B is an explanatory view for explaining how to latch data "1" by the defective address latch circuit.
Figure 23A:
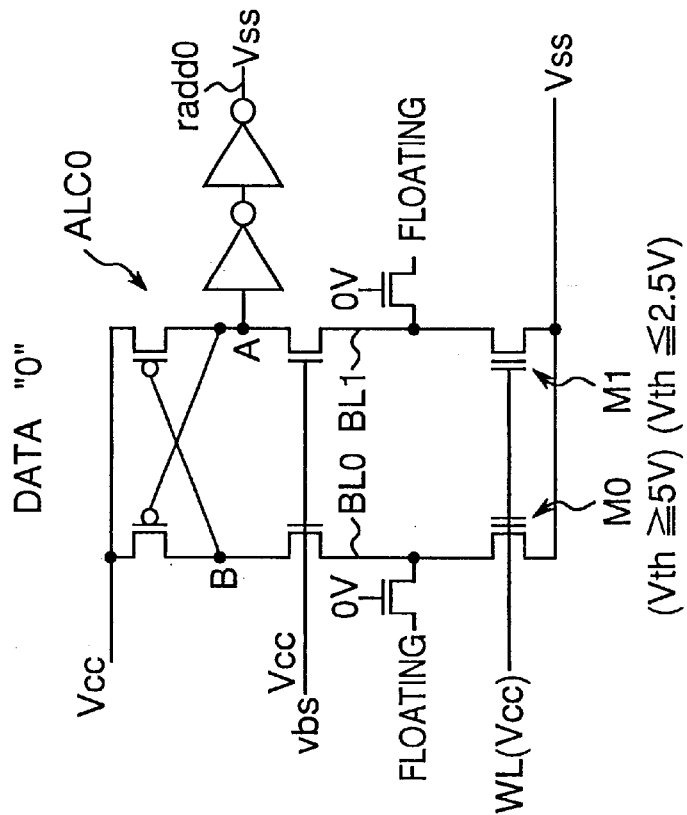
FIG. 23A is an explanatory view for explaining how to latch data "0" by a defective address latch circuit in the second related background art.
Figure 24B:
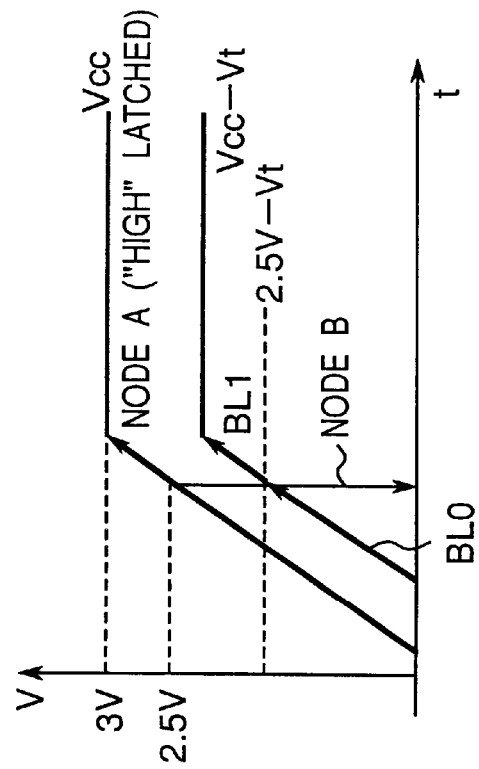
FIG. 24B is a voltage waveform chart of the defective address latch circuit corresponding to FIG. 23B.
Figure 24A:
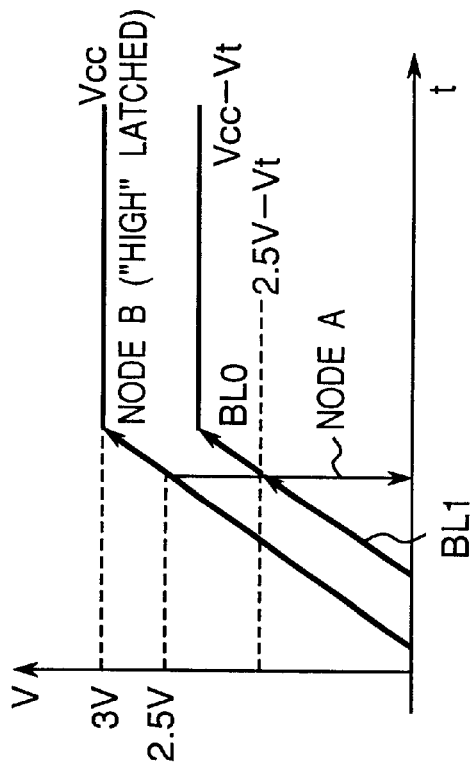
FIG. 24A is a voltage waveform chart of the defective address latch circuit corresponding to FIG. 23A.
Figure 25:
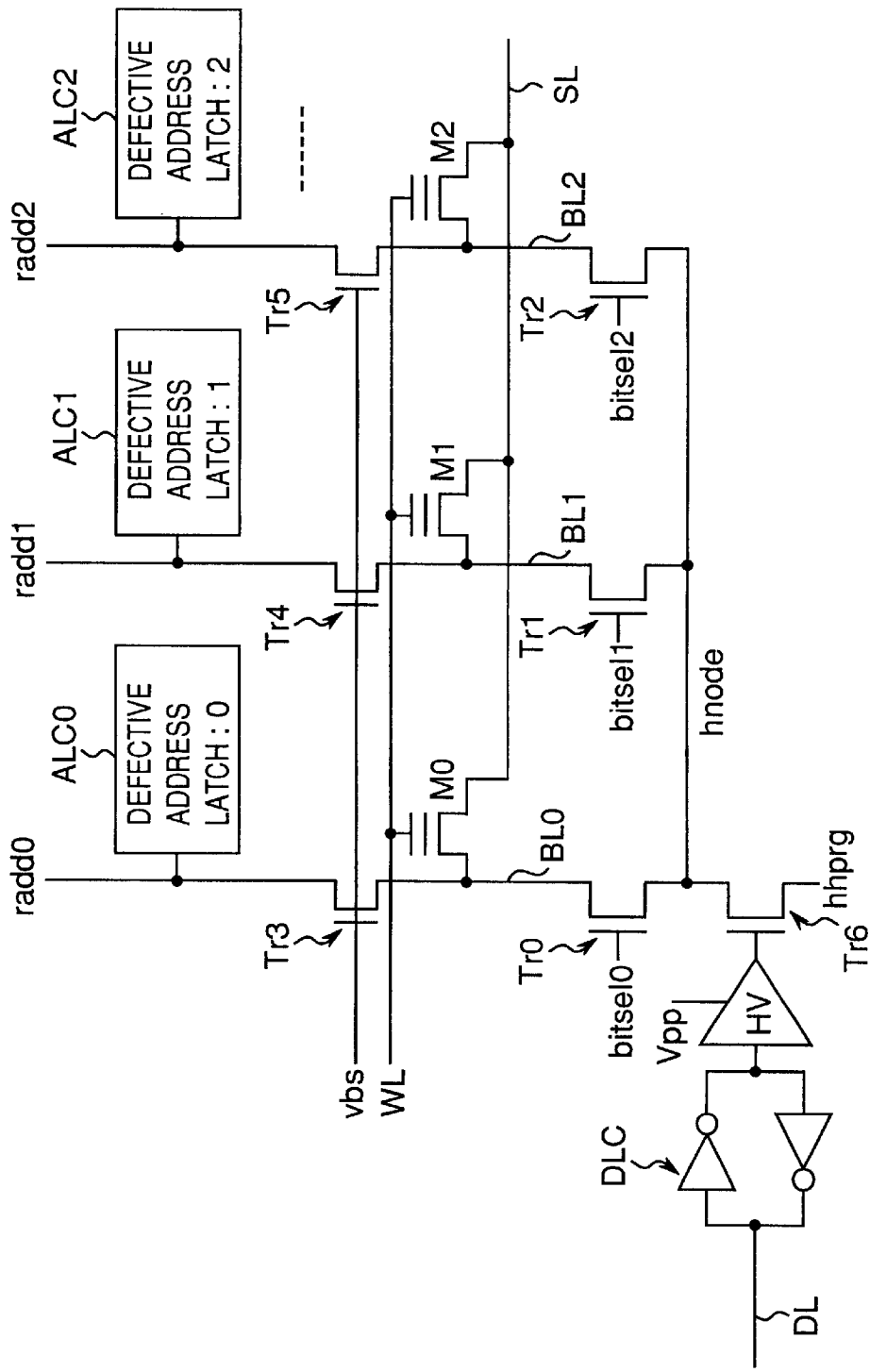
FIG. 25 shows a circuit according to the first related background art.
Figure 26:
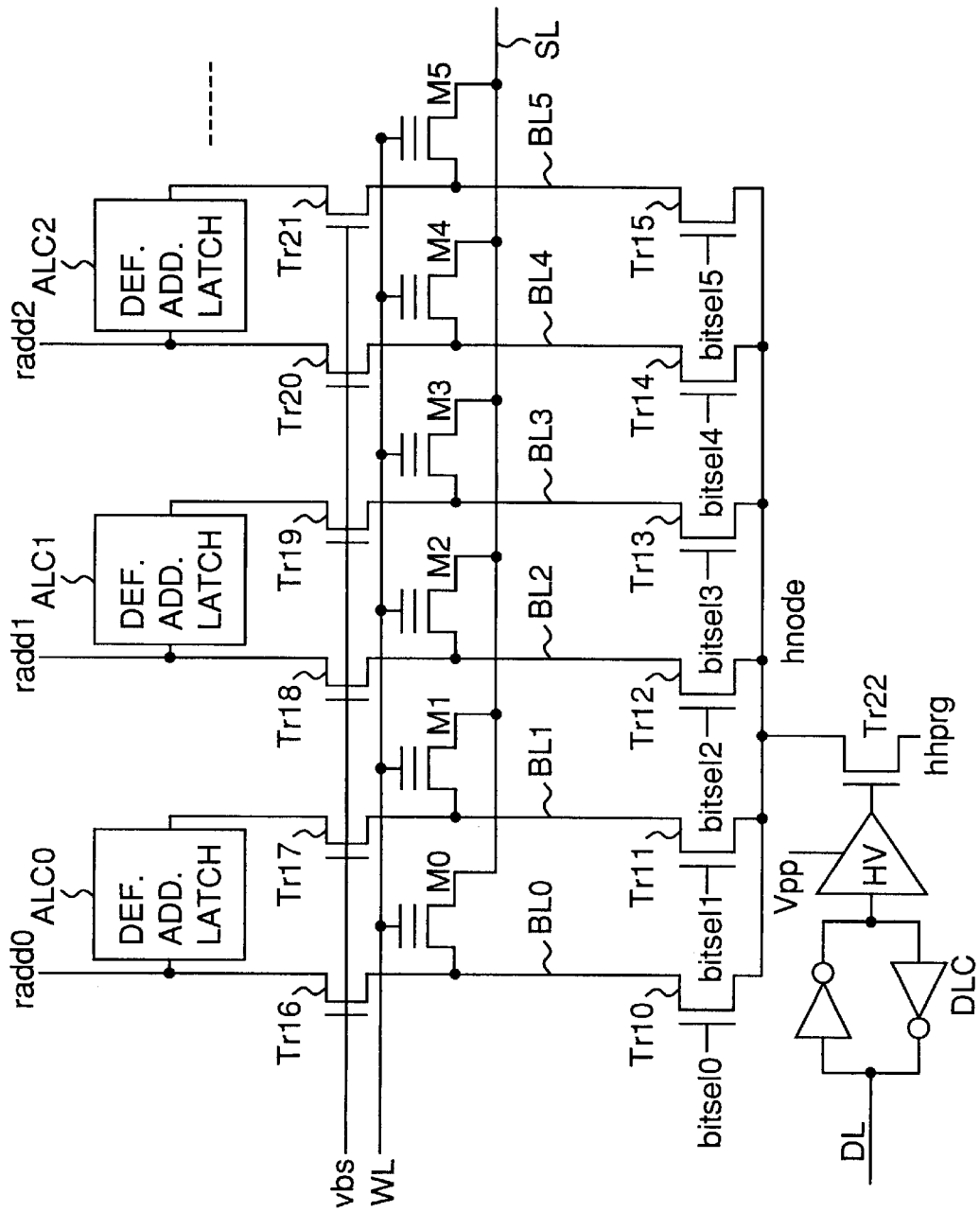
FIG. 26 shows the nonvolatile semiconductor memory device, having a redundant function, of the second related background art.

Then, a verify operation is performed to check whether all the memory cells M0 through M5 connected to the address latch circuits ALC0, ALC1, and ALC2 have a threshold equal to or lower than the threshold, Vt, of the N-MOS transistor Tr10 through Tr21 (e.g. 0.7 volts or lower). In the verify operation, 0.7 volts is applied to the word line WL. Then, the bit selection signal line bitsel0 is brought to the Vcc (for example, 1.8 volts) level. Using a sense amplifier (not shown) connected to the node hnode continuous with the bit line BL0, whether electric current flows through the memory cell M0 is detected. If it is determined that electric current flows through the memory cell M0, it is concluded that the memory cell M0 is placed in the erased state (Vth≦0.7 volts) Then, the verify operation is further performed for the memory cells M1 through M5 sequentially. If it is determined that the thresholds of all the memory cells are 0.7 volts or less, the erase operation is completed. On the other hand, if it is detected that a memory cell has a threshold, Vth, of more than 0.7 volts, pulses for erasure are applied again upon the detection of the memory cell. The application of the erasure pulses will be repeated until the thresholds of all the memory cells become 0.7 volts or less. FIG. 19 shows the state of the thresholds of the memory cells M0 through M5 in the fourth embodiment.

Although not described in detail, the method of writing the data representing the defective address in the fourth embodiment is similar to that in the second embodiment. That is, the writing of the data "101" of the defective address is executed by using the channel hot electrons. As shown in FIG. 19, in the programmed state in which the threshold is high, the threshold is 5 volts or more, whereas in the erased state in which the threshold is low, the threshold is 0.7 volts (threshold of N-MOS transistor) or less.

The operation of the circuit of the fourth embodiment at the power-on of the device will be described with reference to FIGS. 13A, 13B, 14A, and 14B. For example, the case where data "0" is latched, namely, the case where the threshold, Vth, of the memory cell M0 is high (Vth≧5 volts) and the threshold, Vth, of the memory cell M1 is low (Vth≦0.7 volts) will be described below.

As indicated by a power supply turn-on waveform of FIG. 14A, when the supply voltage Vcc increases and the potential of the word line WL becomes 0.7 volts or more, an electric charge is extracted from the node A because the threshold of the memory cell M1 is low. Thus, the potential of the node A becomes 0 volts. In the fourth embodiment, the 0.7 volts corresponds to the threshold, Vt, of the N-MOS transistor and corresponds to the upper limit of the threshold of the memory cell M0 in the erased state.

In the above second embodiment, the ground-side potential Vss (for example, 0 volts) is applied to the word line WL, whereas in the fourth embodiment, the supply voltage Vcc is applied to the word line WL. Therefore, the potential of the word line WL increases together with the supply voltage Vcc. Thus, when the supply voltage Vcc increases to 1.8 volts, electric current of 20 μA or higher flows through the memory cell M1 and the memory rises at a high speed.

On the other hand, because the threshold of the memory cell M0 is 5 volts or more, the potential of the node B is kept at a high level (1.8 volts). As a result, the output voltage of the defective address latch circuit ALC0 is the ground-side potential Vss (data "0"). In the second embodiment, the threshold of the memory cell is 0 volts or less in the erased state, whereas in the fourth embodiment, the threshold of the memory cell is 0.7 volts in the erased state. Increasing the threshold makes it possible to solve the problem of disturb. Increasing the threshold to 0.7 volts does not increase the lower limit of the operating voltage.

The case where the data "1" is latched, namely, the case where the threshold, Vth, of the memory cell M0 is low (Vth≦0.7 volts) and the threshold, Vth, of the memory cell M1 is high (Vth≧5 volts) is described below. As indicated by a power-on waveform of FIG. 14B, when the supply voltage Vcc increases and the potential of the word line WL becomes 0.7 volts or more, an electric charge is extracted from the node B because the threshold of the memory cell M0 is low. As a result, the node B goes to a level of 0 volts. On the other hand, because the threshold of the memory cell M1 is 5 volts or more, the potential of the node A is maintained at a high level (0.7 volts or higher). As a result, the output voltage of the defective address latch circuit ALC0 is the supply voltage Vcc (data "1"). It is necessary that the threshold of the P-MOS transistors of the defective address latch circuit ALC0 is −0.7 volts or more.

In the fourth embodiment, a malfunction does not occur even if a command is issued immediately after the rise of the supply voltage Vcc. Further, a malfunction due to a disturb during operation is eliminated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit for storing and latching defective address data representing an address of a defective portion occurring in a memory cell array of a nonvolatile semiconductor memory device having a redundant function, comprising:

floating gate field effect transistors for storing defective address data, each floating gate field effect transistor being electrically erasable and programmable and having a control gate, a drain, and a source;

a word line connected to the control gates of the floating gate field effect transistors;

bit lines connected to the drains of the floating gate field effect transistors;

a source line connected to the sources of the floating gate field effect transistors; and latch means for latching the data stored in the floating gate field effect transistors, wherein each floating gate field effect transistor assumes one of a high-threshold state and a low-threshold state, and has a threshold of 0 volts or less when in the low-threshold state.

2. The circuit according to claim 1, wherein the threshold of the floating gate field effect transistor in the low-threshold state is less than 0 volts such that the threshold of each of said floating gate field effect transistors is verified by applying a negative voltage to the control gate thereof via the word line.

3. The circuit according to claim 1, wherein the threshold of the floating gate field effect transistor in the low-threshold state is from 0 volts to about −2.5 volts.

4. The circuit according to claim 3, wherein the threshold of each of said floating gate field effect transistors is verified by applying a reference voltage to the control gate thereof via the word line.

5. The circuit according to claim 1, wherein in operation, a reference voltage is applied to the control gates of floating gate field effect transistors which have been programmed with defective address data.

6. The circuit according to claim 5, wherein said reference voltage is a ground voltage.

7. The circuit according to claim 1, further comprising means executing a write operation or an erase operation to allow each of said floating gate field effect transistors to have the threshold of 0 volts or lower.

8. The circuit according to claim 7, wherein said means executing a write operation or an erase operation comprises a word line voltage generator and a source line voltage generator, wherein with the drains of the floating gate field effect transistors in a floating state, the word line voltage generator applies a negative voltage to the word line and the source line voltage generator applies a positive voltage to the source line such that electrons are withdrawn from a floating gate of each of the floating gate field effect transistors.

9. The circuit according to claim 1, wherein one floating gate field effect transistor serves to store one bit of the defective address data.

10. The circuit according to claim 9, wherein said latch means comprises a plurality of latch circuits each connected to one corresponding floating gate field effect transistor via the bit line.

11. The circuit according to claim 1, wherein said floating gate field effect transistors comprise a plurality of pairs of floating gate field effect transistors, and wherein one pair of floating gate field effect transistors serves to store one bit of the defective address data.

12. The circuit according to claim 11, wherein said latch means comprises a plurality of latch circuits each connected to one corresponding pair of floating gate field effect transistors via the bit lines.

13. A circuit for storing and latching defective address data representing an address of a defective portion occurring in a memory cell array of a nonvolatile semiconductor memory device having a redundant function, comprising:

floating gate field effect transistors for storing defective address data, each floating gate field effect transistor being electrically erasable and programmable and having a control gate, a drain, and a source;

a word line connected to the control gates of the floating gate field effect transistors;

bit lines connected to the drains of the floating gate field effect transistors;

a source line connected to the sources of the floating gate field effect transistors;

N-MOS transistors provided on the bit lines; and latch means connected to the floating gate field effect transistors via the bit lines and the N-MOS transistors for latching the data stored in the floating gate field effect transistors, wherein each floating gate field effect transistor assumes one of a high-threshold state and a low-threshold state, and has a threshold equal to or lower than a threshold of the N-MOS transistors when in the low-threshold state.

14. The circuit according to claim 13, wherein the threshold of the floating gate field effect transistor in the low-threshold state is about 0.7 volts or less.

15. The circuit according to claim 13, wherein the threshold of each of said floating gate field effect transistors is verified by applying a voltage equivalent to the threshold of the N-MOS transistor to the control gate thereof via the word line.

16. The circuit according to claim 13, further comprising means executing a write operation or an erase operation to allow each of said floating gate field effect transistors to have the threshold that is equal to or lower than the threshold of the N-MOS transistors.

17. The circuit according to claim 16, wherein said means executing a write operation or an erase operation comprises a word line voltage generator and a source line voltage generator, wherein with the drains of the floating gate field effect transistors in a floating state, the word line voltage generator applies a negative voltage to the word line and the source word line voltage generator applies a positive voltage to the source line such that electrons are withdrawn from a floating gate of each of the floating gate field effect transistors.

18. The circuit according to claim 13, wherein in operation, a supply voltage is applied to the control gates of floating gate field effect transistors which have been programmed with defective address data.

19. The circuit according to claim 18, wherein said supply voltage is about 1.8 volts.

20. The circuit according to claim 13, wherein one floating gate field effect transistor serves to store one bit of the defective address data.

21. The circuit according to claim 20, wherein said latch means comprises a plurality of latch circuits each connected to one corresponding floating gate field effect transistor via the bit line and the N-MOS transistor.

22. The circuit according to claim 13, wherein said floating gate field effect transistors comprise a plurality of pairs of floating gate field effect transistors, and wherein one pair of floating gate field effect transistors serves to store one bit of the defective address data.

23. The circuit according to claim 22, wherein said latch means comprises a plurality of latch circuits each connected to one corresponding pair of floating gate field effect transistors via the bit line and the N-MOS transistor.

* * * * *